US010790325B2

(12) United States Patent
Arbabi et al.

(10) Patent No.: US 10,790,325 B2
(45) Date of Patent: Sep. 29, 2020

(54) IMAGING APPARATUS AND IMAGE SENSOR INCLUDING THE SAME

(71) Applicants: SAMSUNG ELECTRONICS CO., LTD., Suwon-si (KR); CALIFORNIA INSTITUTE OF TECHNOLOGY, Pasadena, CA (US)

(72) Inventors: Amir Arbabi, Pasadena, CA (US); Seunghoon Han, Suwon-si (KR); Andrei Faraon, Pasadena, CA (US); Hyeonsoo Park, Suwon-si (KR)

(73) Assignees: SAMSUNG ELECTRONICS CO., LTD., Suwon-si (KR); CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/597,491

(22) Filed: Oct. 9, 2019

(65) Prior Publication Data

US 2020/0052027 A1 Feb. 13, 2020

Related U.S. Application Data

(63) Continuation-in-part of application No. 16/527,341, filed on Jul. 31, 2019, which is a continuation of (Continued)

(30) Foreign Application Priority Data

Apr. 11, 2016 (KR) ........................ 10-2016-0044268

(51) Int. Cl.

| | |
|---|---|
| ***H01L 27/146*** | (2006.01) |
| *G03B 35/10* | (2006.01) |
| *H04N 5/225* | (2006.01) |

(52) U.S. Cl.

CPC .. *H01L 27/14627* (2013.01); *H01L 27/14605* (2013.01); *H01L 27/14621* (2013.01); *G03B 35/10* (2013.01); *H04N 5/2257* (2013.01)

(58) Field of Classification Search

CPC ......... H01L 27/14627; H01L 27/14625; H01L 27/14605; H01L 27/14621; H04N 5/2257;

(Continued)

(56) References Cited

U.S. PATENT DOCUMENTS

| | | | |
|---|---|---|---|
| 5,760,834 | A | 6/1998 | Rostoker |
| 8,169,879 | B2 | 5/2012 | Kamiguchi et al. |

(Continued)

FOREIGN PATENT DOCUMENTS

| | | | |
|---|---|---|---|
| JP | 2011-99715 | A | 5/2011 |
| KR | 10-2016-0120653 | A1 | 10/2016 |
| KR | 10-2016-0125875 | A | 11/2016 |

OTHER PUBLICATIONS

Arbabi et al., "Subwavelength-thick lenses with high numerical apertures and large efficiency based on high-contrast transmitarrays", May 7, 2015, 6 pages total, Nature Communications.

*Primary Examiner* — John R Lee

(74) *Attorney, Agent, or Firm* — Sughrue Mion, PLLC

(57) ABSTRACT

An image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second (Continued)

light, respectively, of the incident lights onto the light-sensing cells, the first light having a different wavelength than the second light.

20 Claims, 15 Drawing Sheets

Related U.S. Application Data application No. 15/221,719, filed on Jul. 28, 2016, now Pat. No. 10,403,668.

(60) Provisional application No. 62/198,268, filed on Jul. 29, 2015.

(58) Field of Classification Search
CPC .. H04N 5/2254; H04N 13/207; H04N 13/204; H04N 13/214; H04N 13/218; H04N 13/229; G03B 35/10; G03B 35/00
See application file for complete search history.

(56) References Cited

U.S. PATENT DOCUMENTS 9,946,051 B2 4/2018 Han et al.
9,995,930 B2 6/2018 Arabi et al.
10,403,668 B2 * 9/2019 Arbabi .............. H01L 27/14621
2008/0117519 A1 5/2008 Chari et al.
2009/0097381 A1 4/2009 Hamano et al.
2009/0122178 A1 5/2009 Kwon et al.
2009/0219432 A1 9/2009 Palum et al.
2011/0122308 A1 5/2011 Duparre
2011/0228142 A1 9/2011 Brueckner et al.
2012/0091551 A1 4/2012 Marenco
2012/0328240 A1 12/2012 Ma et al.
2013/0002253 A1 1/2013 Werner et al.
2013/0044187 A1 2/2013 Hammes et al.
2013/0293760 A1 11/2013 Nisenzon et al.
2013/0308197 A1 11/2013 Duparre
2013/0321581 A1 12/2013 El-Ghoroury et al.
2014/0267243 A1 9/2014 Venkataraman et al.
2014/0267890 A1 9/2014 Lelescu et al.
2014/0277433 A1 9/2014 Pugh et al.
2014/0307059 A1 10/2014 Haddad et al.
2014/0263982 A1 12/2014 Shkunov et al.
2014/0354855 A1 12/2014 Venkataraman et al.
2015/0061066 A1 3/2015 Murayama
2015/0130973 A1 5/2015 Saito et al.
2015/0373261 A1 12/2015 Rodda et al.
2016/0198143 A1 7/2016 Ishiga
2016/0299337 A1 10/2016 Arbabi et al.
2017/0034500 A1 2/2017 Arbabi et al.
2018/0020209 A1 1/2018 Ko et al.
2018/0084238 A1 3/2018 Chossat et al.
2019/0355772 A1 * 11/2019 Arbabi .............. H01L 27/14605
2020/0052027 A1 * 2/2020 Arbabi ................ H04N 5/2254

* cited by examiner

IMAGING APPARATUS AND IMAGE SENSOR INCLUDING THE SAME

CROSS REFERENCE TO RELATED APPLICATIONS

This is a continuation-in-part application of U.S. patent application Ser. No. 16/527,341, filed Jul. 31, 2019, in the U.S. Patent and Trademark Office, which is a continuation application of U.S. patent application Ser. No. 15/221,719, filed Jul. 28, 2016, now U.S. Pat. No. 10,403,668, issued Sep. 3, 2019, in the U.S. Patent and Trademark Office, which claims priority from U.S. Provisional Patent Application No. 62/198,268, filed on Jul. 29, 2015, in the U.S. Patent and Trademark Office, and Korean Patent Application No. 10-2016-0044268, filed on Apr. 11, 2016, in the Korean Intellectual Property Office, the disclosures of which are incorporated herein by reference in their respective entireties.

STATEMENT REGARDING FEDERALLY SPONSORED RESEARCH OR DEVELOPMENT

This invention was made with government support under Grant No. W911NF-14-1-0345 awarded by U.S. Army. The government has certain rights in the invention.

BACKGROUND

1. Field

Apparatuses and methods consistent with exemplary embodiments relate to image sensors.

2. Description of the Related Art

Optical sensors including semiconductor sensor arrays may be used in mobile devices, wearable devices, and the Internet of Things. Although such devices should be small, it is difficult to reduce the thicknesses of imaging apparatuses included in these devices.

Also, as demand for a 3-dimensional image sensor to be used in the Internet of Things, game devices, and other mobiles has increased, an optical system capable of controlling pathways of light incident onto the 3-dimensional image sensor is needed. However, because a conventional 3-dimensional image sensor includes complicated optical lenses, it has been difficult to manufacture an appropriate 3-dimensional image sensor for use in such devices.

SUMMARY

Exemplary embodiments may address at least the above problems and/or disadvantages and other disadvantages not described above. Also, the exemplary embodiments are not required to overcome the disadvantages described above, and may not overcome any of the problems described above.

Provided are image sensors that may be configured to have a small size and may be configured to obtain 3-dimensional information about an object.

According to an aspect of an exemplary embodiment, an image sensor includes an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses are configured to concentrate a first light and a second light, respectively, of the incident lights onto the light-sensing cells, the first light having a different wavelength than the second light.

The substrate may include sub-substrates, and the thin lenses and the light-sensing cells may be respectively disposed on a first surface and a second surface of each of the sub-substrates.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

The scatterers may include at least one from among silicon, gallium phosphide, SiC, SiN, and $TiO_2$.

Shapes of the scatterers and interval distances between respective pairs of the scatterers may vary with a respective wavelength of light concentrated by a respective one among the thin lenses.

The image sensor may further include light filters, each of the light filters being configured to filter a respective wavelength of light incident on a respective one among the light-sensing cells.

The image sensor may further include an image synthesizer configured to generate a multi-color image by synthesizing images of different colors, and at least two among the light-sensing cells may produce the images of different colors.

The image sensor may further include an image synthesizer configured to generate a stereo image based on images that are produced by the light-sensing cells.

The image synthesizer may be further configured to extract depth information about an object appearing in the stereo image.

According to an aspect of an exemplary embodiment, an image sensor includes a substrate, thin lenses disposed on a first surface of the substrate and configured to concentrate lights incident on the first surface, and light-sensing cells disposed on a second surface of the substrate, the second surface facing the first surface, and the light-sensing cells being configured to sense lights passing through the thin lenses, and generate electrical signals based on the sensed lights. A first thin lens and second thin lens of the thin lenses may be configured to concentrate a first light and a second light, respectively, of the incident lights to have different focal lengths.

The substrate may include sub-substrates, and the thin lenses and the light-sensing cells may be respectively disposed on a first surface and a second surface of each of the sub-substrates.

The concentrated lights may have predetermined wavelengths.

Each of the thin lenses may include scatterers, and each of the scatterers may have a pillar structure.

An interval distance between a pair of the scatterers may be less than a respective wavelength of light concentrated by a respective one among the thin lenses.

A height of the scatterers may be less than a respective wavelength of light concentrated by a respective one among the thin lenses.

Shapes of the scatterers and interval distances between respective pairs of the scatterers may vary with a respective wavelength of light concentrated by a respective one among the thin lenses.

The image sensor may further include a depth map calculator configured to calculate a defocusing degree of an image that is produced on each of the light-sensing cells, and calculate depth map information about an image that is produced by the incident lights, based on the defocusing degree.

The image sensor may further include a light filter layer configured to filter a wavelength of light incident on each of the light-sensing cells.

According to another aspect of an exemplary embodiment, an image sensor includes: a substrate; a first thin lens configured to concentrate light of a first wavelength and including a plurality of first scatterers disposed on the substrate; a second thin lens configured to concentrate light of a second wavelength, and including a plurality of second scatterers disposed on the substrate; and a plurality of light-sensing cells configured to sense the light concentrated by the first thin lens and the second thin lens, wherein at least two of the plurality of first scatterers or at least two of the plurality of second scatterers have different heights to each other.

A height difference between the at least two of the plurality of first scatterers may be equal to or less than $2\lambda_1$ with respect to the first wavelength $\lambda_1$.

A height H of the plurality of first scatterers may be in a range that $\lambda_1/2 \leq H \leq 3\lambda_1$ with respect to the first wavelength $\lambda_1$.

A height difference between the at least two of the second scatterers may be equal to or less than $2\lambda_2$ with respect to the second wavelength $\lambda_2$.

A height H of the plurality of second scatterers may be in a range that $\lambda_2/2 \leq H \leq 3\lambda_2$ with respect to the second wavelength $\lambda_2$.

The image sensor may further include a low refractive index material layer covering the plurality of first scatterers, wherein the first thin lens further includes a plurality of third scatterers disposed on the low refractive index material layer.

The plurality of first scatterers and the plurality of third scatterers may face each other to be misaligned with each other.

A separation distance in a height direction between a first scatterer and a third scatterer, which are adjacent to each other, among the plurality of first scatterers and the plurality of third scatterers may be greater than $\lambda_1/2$ with respect to the first wavelength $\lambda_1$.

A shape distribution of the plurality of first scatterers and a shape distribution of the plurality of third scatterers may be determined to have different distributions of performance indexes by locations from each other.

A shape distribution of the plurality of first scatterers and a shape distribution of the plurality of third scatterers may be determined to compensate for non-uniformity of focusing performance by locations.

At least two of the plurality of third scatterers may have different heights to each other.

The low refractive index material layer may cover the plurality of second scatterers, and the second thin lens may further include a plurality of fourth scatterers disposed on the low refractive index material layer.

At least two of the plurality of fourth scatterers may have different heights to each other.

The first thin lens may concentrate light of the first wavelength with a first focal length, and the second thin lens may concentrate light of the second wavelength with the first focal length.

The image sensor may further include a third thin lens configured to concentrate the light of the first wavelength with a second focal length that is different from the first focal length, the third thin lens including a plurality of fifth scatterers formed on the substrate.

Each of the first thin lens and the third thin lens may include a plurality of regions in which a phase modulation in a predetermined range is repeated, and the numbers of the plurality of regions in the first thin lens and the third thin lens may be different from each other.

At least two of the plurality of fifth scatterers may have different heights to each other.

The image sensor may further include a fourth thin lens configured to concentrate the light of the second wavelength with the second focal length that is different from the first focal length, the fourth thin lens including a plurality of sixth scatterers formed on the substrate.

At least two of the plurality of sixth scatterers may have different heights to each other.

The image sensor may further include a low refractive index material layer covering the plurality of fifth scatterers and the plurality of sixth scatterers, wherein the third thin lens further includes a plurality of seventh scatterers disposed on the low refractive index material layer, and the fourth thin lens further includes a plurality of eighth scatterers disposed on the low refractive index material layer.

BRIEF DESCRIPTION OF THE DRAWINGS

The above and/or other aspects will be more apparent by describing exemplary embodiments with reference to the accompanying drawings.

DETAILED DESCRIPTION

Figure 1:
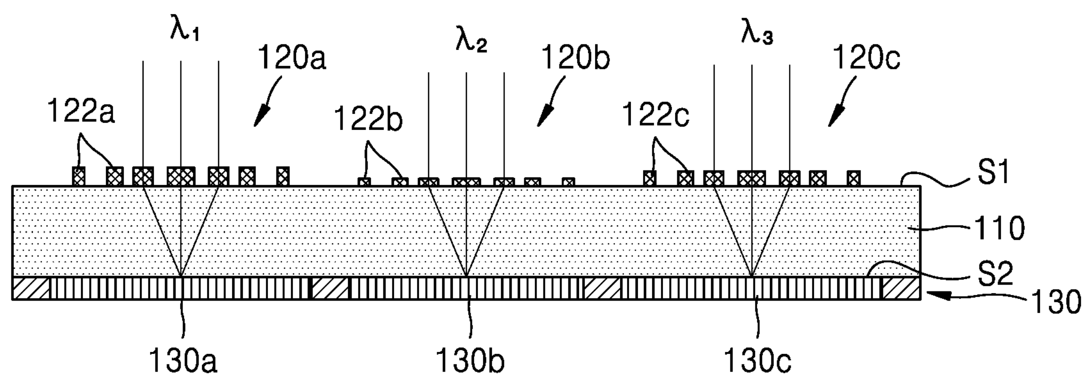
FIG. 1 is a cross-sectional view illustrating an image sensor according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

As used herein, the term "and/or" includes any and all combinations of one or more of the associated listed items. Expressions such as "at least one of," when preceding a list of elements, modify the entire list of elements and do not modify the individual elements of the list.

In the drawings, the thicknesses of layers and regions are exaggerated for clarity. It will also be understood that when a layer is referred to as being "on" another layer or substrate, it can be directly on the other layer or substrate, or intervening layers may also be present.

The terms used in this specification are those general terms currently widely used in the art in consideration of functions in regard to the inventive concept, but the terms may vary according to the intention of those of ordinary skill in the art, precedents, or new technology in the art. Also, specified terms may be selected by the applicant, and in this case, the detailed meaning thereof will be described in the detailed description. Thus, the terms used in the specification may be understood not as simple names but based on the meaning of the terms and the overall description.

Throughout the specification, it will be understood that when a component is connected to another component, the component may be directly connected as well as electrically connected with another element therebetween.

It will be further understood that the terms "comprises" and/or "comprising" used herein specify the presence of stated features or components, but do not preclude the presence or addition of one or more other features or components. In addition, the terms such as "unit," "-er (-or)," and "module" described in the specification refer to an element for performing at least one function or operation, and may be implemented in hardware, software, or the combination of hardware and software.

Additionally, it will be understood that although the terms "first," "second," etc. may be used herein to describe various components, these components may not be limited by these terms. These components are only used to distinguish one component from another.

Descriptions of embodiments below may not be understood as limiting the scope of right, but those easily inferred by one of ordinary skill in the art may be understood as belonging to the scope or right of the exemplary embodiments. Hereinafter, embodiments will be described in detail by referring to the accompanying drawings for the purpose of describing examples only.

FIG. 1 is a cross-sectional view illustrating an image sensor according to an exemplary embodiment.

Referring to FIG. 1, the image sensor according to an exemplary embodiment may include a substrate 110, a plurality of thin lenses 120*a*, 120*b*, and 120*c* that are arranged on a first surface S1, and a plurality of light-sensing cells 130*a*, 130*b*, and 130*c* arranged on a second surface S1 facing the first surface S1 of the substrate 110. At least two from among the thin lenses 120*a*, 120*b*, and 120*c* may concentrate lights having different wavelength components on the light-sensing cells 130*a*, 130*b*, and 130*c*. That is, two or more of the thin lenses 120*a*, 120*b*, and 120*c* may have wavelength selectivity with respect to different wavelengths.

The substrate 110 may have a plate-like shape. The first surface S1 and the second surface S2 of the substrate 110 may be substantially horizontally parallel to each other. However, the first surface S1 and the second surface S2 may not be completely horizontally parallel to each other and may be obliquely parallel to each other. The substrate 110 and the light-sensing cells 130*a*, 130*b*, and 130*c* may be spaced apart from one another with an air layer therebetween. The substrate 110 may include a transparent material. As used herein, the term "transparent material" denotes a material having a high light transmittance. For example, the substrate 110 may include at least one from among $Si_3N_4$, $SiO_2$, and a polymer such as PMMA or PDMS. Once a path of incident light changes at the light-sensing cells 130*a*, 130*b*, and 130*c*, the incident light may pass through the substrate 110 and become incident on a light sensing layer 130.

Each of the light-sensing cells 130*a*, 130*b*, and 130*c* may include scatterers from among a plurality of scatterers 122*a*, 122*b*, and 122*c*. The term "thin-lens" refers to an optical device that changes a path of light by a difference in phase delays caused by the scatterers 122*a*, 122*b*, and 122*c* included in the thin-lenses, unlike related art optical lens. Accordingly, a thickness of the thin-lens may be hardly limited compared to that of an optical lens, and the thin-lens may be configured to be thin. The scatterers 122*a*, 122*b*, and 122*c* on surfaces of the thin lenses 120*a*, 120*b*, and 120*c* may be configured to resonate light incident on each of the scatterers 122*a*, 122*b*, and 122*c*. The scatterers 122*a*, 122*b*, and 122*c* may be configured to appropriately delay a transmission phase of the light incident on each of the scatterers 122*a*, 122*b*, and 122*c*.

The scatterers 122*a*, 122*b*, and 122*c* may be arranged on the first surface S1 of the substrate 110 to form a desired wave front of light that transmits from the first surface S1 of the substrate 110. Also, the thin lenses 120*a*, 120*b*, and 120*c* may change a path of transmittant light with respect to incident light by modulating a wave front of light.

At least two from among the thin lenses 120*a*, 120*b*, and 120*c* may be configured to concentrate pieces of light having different wavelength components among the incident light on the light sensing layer 130. For example, a first thin-lens 120*a* may be configured to concentrate a piece of light having a first wavelength $\lambda_1$ among the incident light. Also, a second thin-lens 120*b* may be configured to concentrate a piece of light having a second wavelength $\lambda_2$ among the incident light. Also, a third thin-lens 120*c* may be configured to concentrate a piece of light having a third wavelength $\lambda_3$ among the incident light. However, these are provided as examples for illustrative purpose only, and embodiments are not limited thereto. For example, not all of the first to third thin lenses 120*a*, 120*b*, and 120*c* have to concentrate pieces of light having different wavelengths, and two from among the first, second, and third thin lenses 120*a*, 120*b*, and 120*c* may be configured to concentrate pieces of light having substantially the same wavelength.

Figure 2:
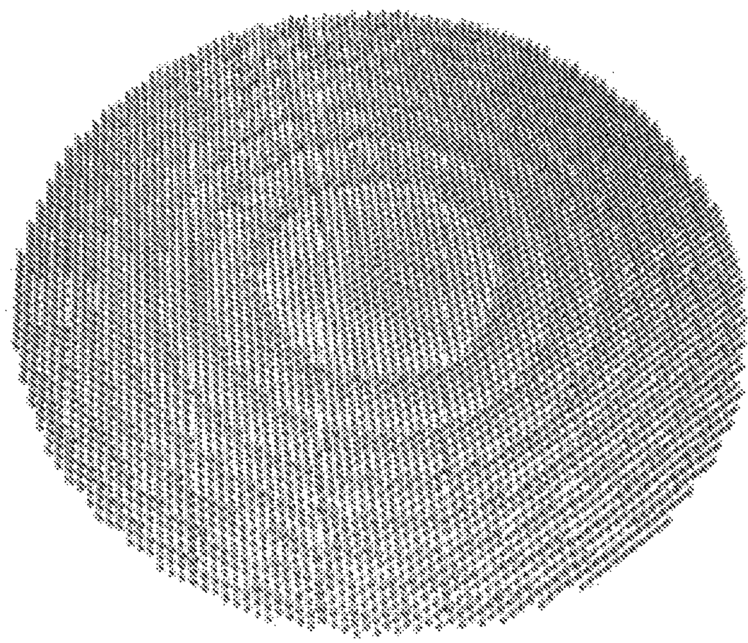
FIG. 2 is a view illustrating a surface of a thin lens according to an exemplary embodiment.

FIG. 2 is a view illustrating a surface of one from among the thin lenses 120*a*, 120*b*, and 120*c* according to an exemplary embodiment.

Referring to FIG. 2, a plurality of scatterers may be arranged on a surface of a thin-lens. A wave form of light transmitted from the thin-lens may depend on a shape, an interval distance, and a shape of arrangement of the scatterers. When the scatterers are formed on the surface of the thin-lens as shown in FIG. 2, light transmitted from the thin-lens may be concentrated. That is, the thin-lens shown in FIG. 2 may be configured as a lens having positive refractive power.

FIGS. 3A, 3B, 3C, and 3D are perspective views illustrating various shapes of the scatterers 122*a*, 122*b*, and 122*c* according to exemplary embodiments.

Figure 3A:
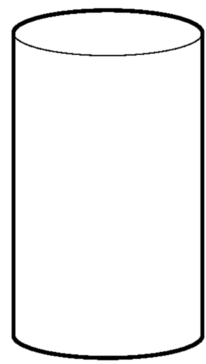
FIGS. 3A, 3B, 3C, and 3D are perspective views illustrating various shapes of scatterers according to exemplary embodiments.
Figure 3B:
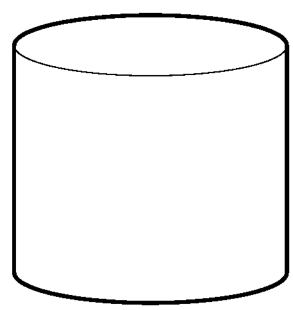
Figure 3C:
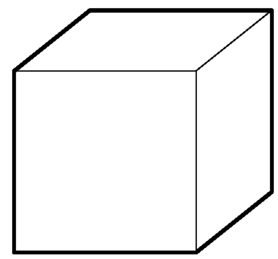
Figure 3D:
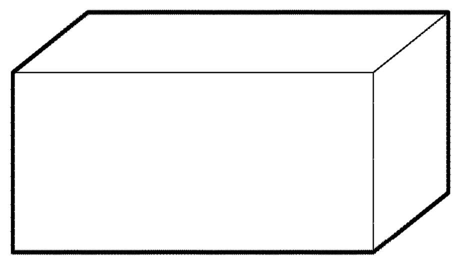

Referring to FIGS. 3A through 3D, the scatterers 122*a*, 122*b*, and 122*c* included in the thin lenses 120*a*, 120*b*, and 120*c* may have pillar structures. A shape of a cross-section of the pillar structure may be from among a circle, an oval, a rectangle, and a square. FIG. 3A illustrates a scatterer having a pillar structure with a cross-sectional shape of a circle. FIG. 3B illustrates a scatterer having a pillar structure with a cross-sectional shape of an oval. FIG. 3C illustrates a scatterer having a pillar structure with a cross-sectional shape of a square. FIG. 3D illustrates a scatterer having a pillar structure with a cross-sectional shape of a rectangle. The pillar structure may be appropriately tilted in a height direction.

FIGS. 3A through 3D show examples of shapes of the scatterers 122*a*, 122*b*, and 122*c*, but embodiments are not limited thereto. For example, at least one from among the scatterers 122*a*, 122*b*, and 122*c* may have a polygonal prism shape or a pillar structure with a cross-section having an “L”-like shape. At least one from among the scatterers 122*a*, 122*b*, and 122*c* may have a multi-layer structure formed of materials with different refractive indexes in a height direction. Also, shapes of the scatterers 122*a*, 122*b*, and 122*c* may not have symmetricity in a direction. For example, a cross-section of the scatterers 122*a*, 122*b*, and 122*c* may have shapes that are non-symmetrical in a horizontal direction such as, for example, an oval shape. Also, when cross-sections of the scatterers 122*a*, 122*b*, and 122*c* differ according to their height, the shapes of the scatterers 122*a*, 122*b*, and 122*c* may not have symmetricity with respect to the height.

The scatterers 122*a*, 122*b*, and 122*c* may have a shape according to wavelength selectivity of the thin lenses 120*a*, 120*b*, and 120*c*. Here, the term “wavelength selectivity” refers to each of the thin lenses 120*a*, 120*b*, and 120*c* selectively concentrating pieces of light of a predetermined wavelength band on the light sensing layer 130. For example, the scatterers 122*a* included in the first thin-lens 120*a* may have a shape appropriate to concentrate pieces of light of the first wavelength $\lambda_1$. In one embodiment, a cross-sectional shape of scatterers 122*a* and a ratio between a width and a height of the scatterers 122*a* may change. Also, scatterers 122*b* included in the second thin-lens 120*b* may have a shape appropriate to concentrate pieces of light of the second wavelength $\lambda_2$. Also, scatterers 122*c* included in the third thin-lens 120*c* may have a shape appropriate to concentrate pieces of light of the third wavelength $\lambda_3$. At least two from among the first, second, and third wavelengths $\lambda_1$, $\lambda_2$, and $\lambda_3$ may be different from each other.

Figure 4:
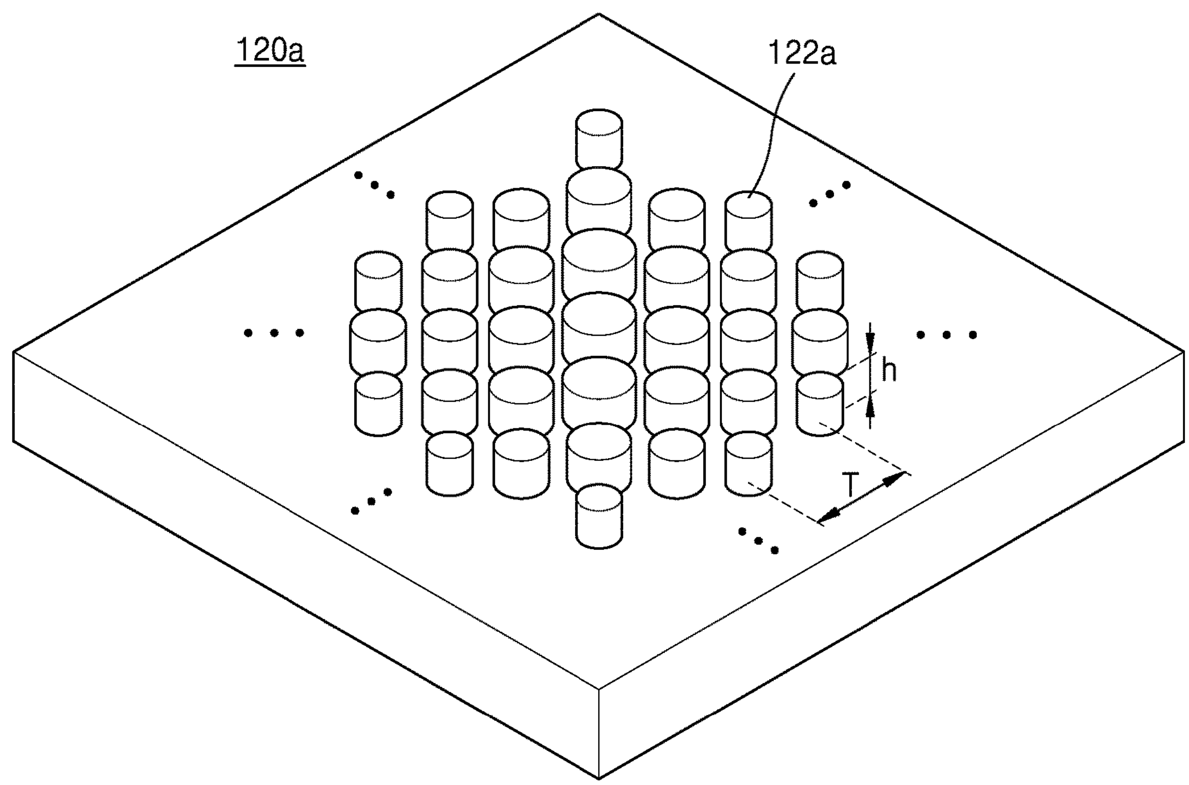
FIG. 4 is a view of a surface illustrating a first thin lens according to an exemplary embodiment.

FIG. 4 is a view illustrating a surface of the first thin-lens 120*a* according to an exemplary embodiment.

In FIG. 4, the first thin-lens 120*a* is used as an example, but the description with reference to FIG. 4 may be applied to the second and third thin lenses 120*b* and 120*c*.

Referring to FIG. 4, the scatterers 122*a* having pillar structures may be disposed on the substrate 110. In FIG. 4, the scatterers 122*a* have circular pillar structures as an example, but embodiments are not limited thereto. For example, the scatterers 122*a* may have any of various shapes such as polygonal prism shapes, circular cylindrical shapes, or elliptic cylindrical shapes. Alternatively, cross-sections of the scatterers 122*a* may have “L”-like prism shapes.

A refractive index of a material included in the scatterers 122*a* may be higher than a refractive index of a material included in the substrate 110. Thus, the substrate 110 may include a material having a relatively low refractive index, and the scatterers 122*a* may include a material having a relatively high refractive index. For example, the scatterers 122*a* may include at least one from among crystalline silicon (c-Si), polycrystalline silicon (poly Si), amorphous silicon (amorphous Si), $Si_3N_4$, GaP, $TiO_2$, AlSb, AlAs, AlGaAs, AlGaInP, BP, and $ZnGeP_2$. Also, for example, the substrate 110 may include one from among a polymer such as PMMA or PDMS, $Si_3N_4$, and $SiO_2$. An additional clad layer that surrounds and covers the scatterers 122*a* having a high refractive index on the substrate 110 with the material having a low refractive index may be formed.

The arrangement of the scatterers 122*a* may be determined according to a wavelength band of light that is concentrated by the first thin-lens 120*a*. For example, an interval distance T and an arrangement direction of the scatterers 122*a* included in the first thin-lens 120*a* may be determined in correspondence to the first wavelength $\lambda_1$ of light that is concentrated by the first thin-lens 120*a*. The interval distance T between the scatterers 122*a* of the first thin-lens 120*a* may be smaller than the first wavelength $\lambda_1$. In one embodiment, the interval distance T between the scatterers 122*a* of the first thin-lens 120*a* may be ¾ of the first wavelength $\lambda_1$ or less or ⅔ of the first wavelength $\lambda_1$ or less. Also, a height h of the scatterers 122*a* of the first thin-lens 120*a* may be smaller than the first wavelength $\lambda_1$. For example, the height h of the scatterers 122*a* of the first thin-lens 120*a* may be ⅔ of the first wavelength $\lambda_1$ or less.

Figure 5:
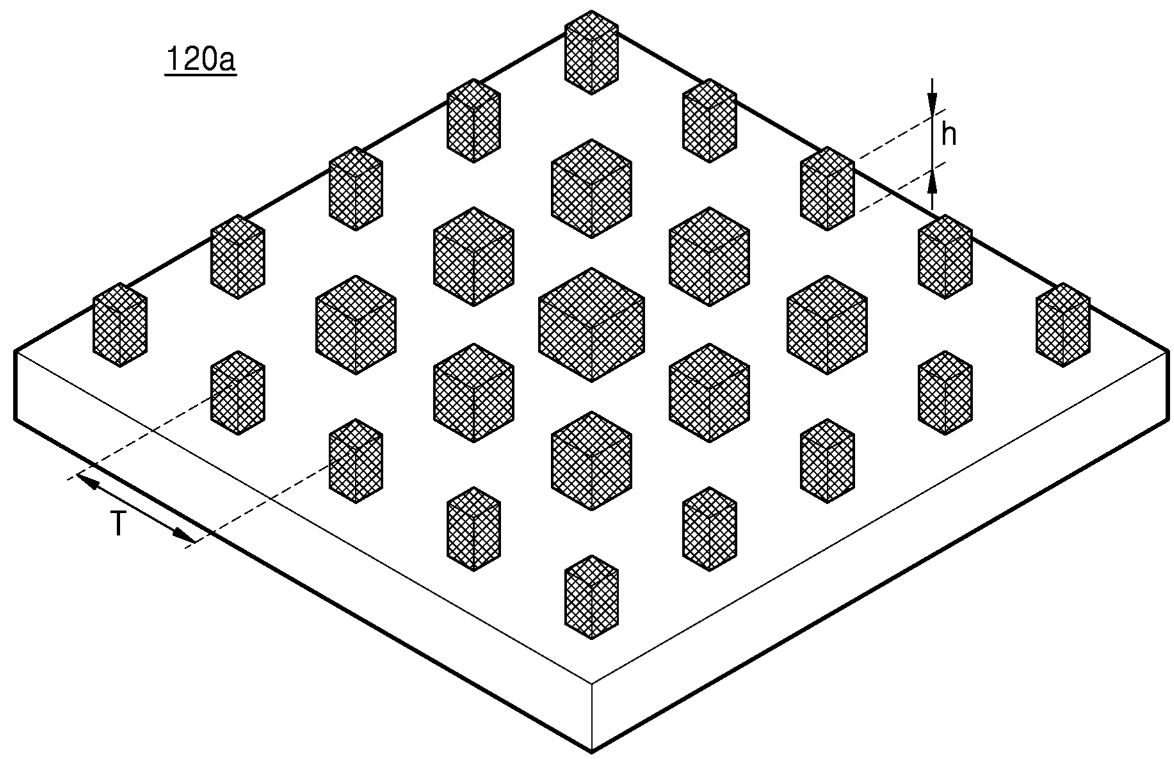
FIG. 5 is a view illustrating a surface of a first thin lens according to another exemplary embodiment.

FIG. 5 is a view illustrating a surface of the first thin lens 120*a* according to another exemplary embodiment.

Referring to FIG. 5, the scatterers 122*a* have rectangular parallelepiped shapes and may be disposed on the substrate 110. Although the scatterers 122*a* have rectangular parallelepiped shapes in FIG. 5, exemplary embodiments are not limited thereto. For example, the scatterers 122*a* may have any shape including polygonal prism shapes, circular cylindrical shapes, and elliptic cylindrical shapes. Alternatively, cross-sections of the scatterers 122*a* may have "L"-like prism shapes. Also, heights and interval distances of the scatterers 122*a* may vary according to a wavelength selectivity of the first thin-lens 120*a*.

The description of shapes of the scatterers 122*a* made with reference to FIGS. 4 and 5 may apply to the scatterers 122*b* and 122*c* included in the second and third thin lenses 120*b* and 120*c*. However, shapes, interval distances, and arrangement directions of the scatterers 122*b* and 122*c* may vary according to a wavelength selectivity of each of the second and third thin lenses 120*b* and 120*c*. For example, interval distances and heights of the scatterers 122*b* included in the second thin-lens 120*b* may be determined according to the second wavelength $\lambda_2$. The interval distances and heights of the scatterers 122*b* included in the second thin-lens 120*b* may be smaller than the second wavelength $\lambda_2$. Also, interval distances and heights of the scatterers 122*c* included in the third thin-lens 120*c* may be determined according to the third wavelength $\lambda_3$. The interval distances and heights of the scatterers 122*c* included in the third thin-lens 120*c* may be smaller than the third wavelength $\lambda_3$.

Referring back to FIG. 1, the light-sensing cells 130*a*, 130*b*, and 130*c* may be configured to generate electrical signals upon sensing light that transmitted from at least one from among the thin lenses 120*a*, 120*b*, and 120*c*. The light-sensing cells 130*a*, 130*b*, and 130*c* may be formed in the light sensing layer 130. However, exemplary embodiments are not limited thereto, and the light-sensing cells 130*a*, 130*b*, and 130*c* may be separated from each other.

The light-sensing cells 130*a*, 130*b*, and 130*c* may be prepared in correspondence to the thin lenses 120*a*, 120*b*, and 120*c*. For example, a first light-sensing cell 130*a* may be configured to sense light that is transmitted from the first thin-lens 120*a*. Also, a second light-sensing cell 130*b* may be configured to sense light that is transmitted from the second thin-lens 120*b*. Also, a third light-sensing cell 130*c* may be configured to sense light that is transmitted from the third thin-lens 120*c*. The first, second, and third light-sensing cells 130*a*, 130*b*, and 130*c* may be configured to receive light and thus may output first, second, and third images, respectively.

Each of the light-sensing cells 130*a*, 130*b*, and 130*c* may include devices that convert light signals into electrical signals. For example, the light-sensing cells 130*a*, 130*b*, and 130*c* may include CCD sensors or CMOS sensors. Alternatively, the light-sensing cells 130*a*, 130*b*, and 130*c* may include photodiodes that convert light energy into electrical energy.

Because at least two from among the first, second, and third thin lenses 120*a*, 120*b*, and 120*c* have different wavelength selectivities, at least two of the first, second, and third light-sensing cells 130*a*, 130*b*, and 130*c* may be configured to measure images in different colors. Therefore, the first, second, and third images measured by the first, second, and third light-sensing cells 130*a*, 130*b*, and 130*c*, respectively, may be synthesized to obtain a multi-color image.

Figure 6:
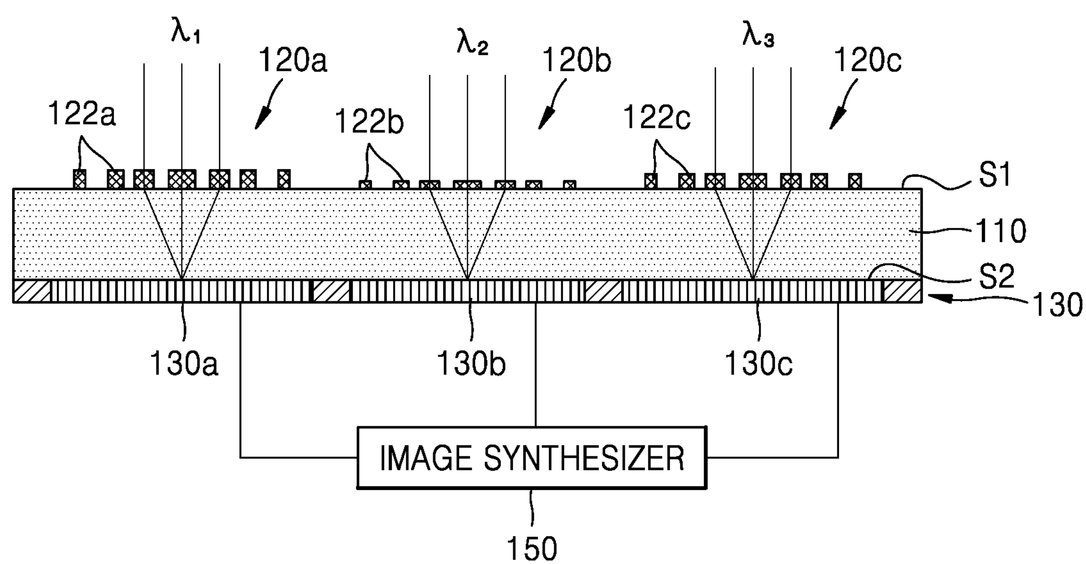
FIG. 6 is a view illustrating an image sensor according to an exemplary embodiment.

FIG. 6 is a view illustrating an image sensor according to an exemplary embodiment.

In FIG. 6, a repeated explanation of the same elements or operations as those in FIG. 1 will not be given.

Referring to FIG. 6, the image sensor according to an exemplary embodiment may include an image synthesizer 150 configured to synthesize images in different colors and thus produces a multi-color image. The image synthesizer 150 may synthesize the first, second, and third images obtained by the first, second, and third light-sensing cells 130*a*, 130*b*, and 130*c*. At least two among the first, second, and third images may be in different colors. Thus, the image synthesizer 150 may produce a multi-color image by synthesizing the first, second, and third images. The multi-color image may be an image in a plurality of colors. Also, when there are four or more light-sensing cells configured to perform an imaging process on four or more different wavelength bands, the multi-color image may be a hyperspectral image.

Because locations of the thin-lens 120*a*, 120*b*, and 120*c* are different from each other, light reflected by an object may be incident at different angles to the thin-lens 120*a*, 120*b*, and 120*c*. Thus, images of the object taken from different angles may be obtained from the first, second, and third light-sensing cells 130*a*, 130*b*, and 130*c*, respectively. The image synthesizer 150 may produce a stereo image from the images of the object taken from different angles. During a process of producing the stereo image, the image synthesizer 150 may extract parallax information among the first, second and third images. Also, the image synthesizer 150 may be configured to extract depth information of the object that is shown in the stereo image.

Figure 7:
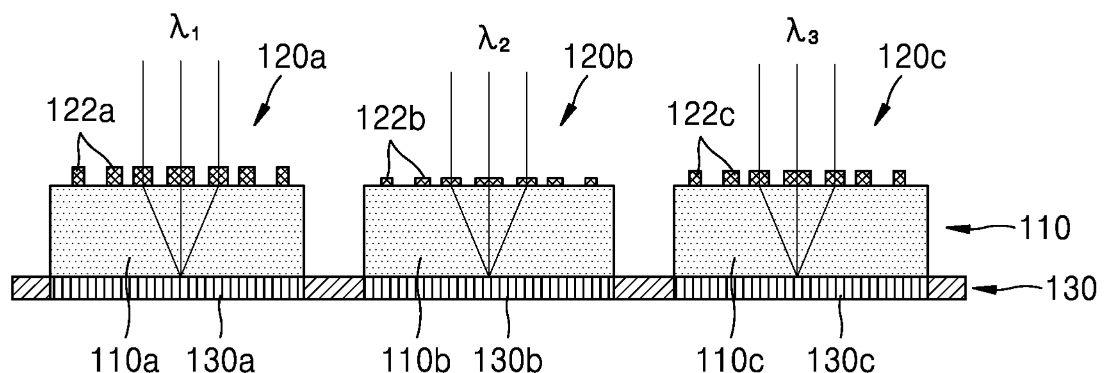
FIG. 7 is a view illustrating an image sensor according to an exemplary embodiment.

FIG. 7 is a view illustrating an image sensor according to an exemplary embodiment.

In FIG. 7, a repeated explanation of the same elements or operations as those in FIG. 1 will not be given.

Referring to FIG. 7, the substrate 110 may include a plurality of sub-substrates 110*a*, 110*b*, and 110*c*. The sub-substrates 110*a*, 110*b*, and 110*c* may be formed in correspondence to a respective thin lens of the plurality of thin lenses 120*a*, 120*b*, and 120*c*, and a respective light-sensing cell of the plurality of light-sensing cells 130*a*, 130*b*, and 130*c*. For example, the first thin-lens 120*a* and the first light-sensing cell 130*a* may be formed on a first and second surface of a first sub-substrate 110*a*, respectively. Also, the second thin-lens 120*b* and the second light-sensing cell 130*b* may be formed on a first and second surface of a second sub-substrate 110*b*, respectively. Also, the third thin-lens 120*c* and the third light-sensing cell 130*c* may be formed on a first and second surface of a third sub-substrate 110*c*, respectively. When the substrate 110 is divided into the sub-substrates 110*a*, 110*b*, and 110*c*, interference between pieces of light that are incident on each of the light-sensing cells 130*a*, 130*b*, and 130*c* may be prevented.

Figure 8:
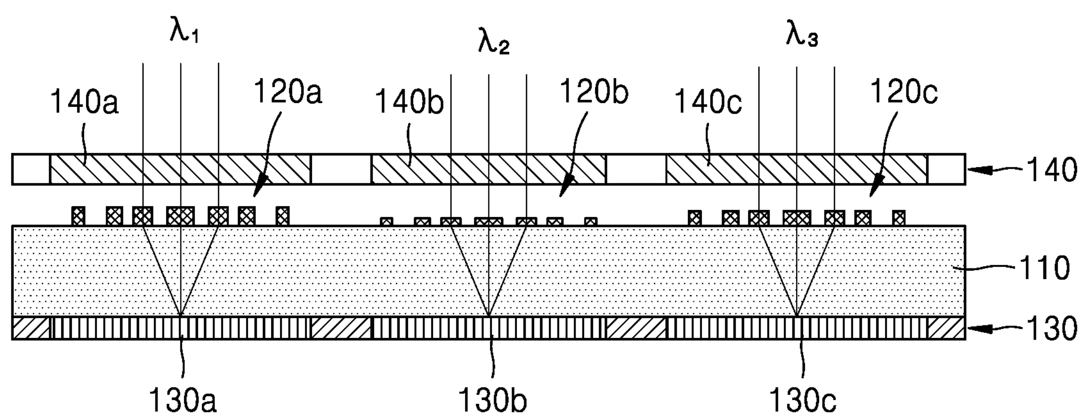
FIG. 8 is a view illustrating an image sensor according to an exemplary embodiment.

FIG. 8 is a view illustrating an image sensor according to an exemplary embodiment.

In FIG. 8, a repeated explanation of the same elements or operations as those in FIG. 1 will not be given.

Referring to FIG. 8, another image sensor according to an exemplary embodiment may include a plurality of light filters 140*a*, 140*b*, and 140*c*, and each light filter in the plurality of light filters 140*a*, 140*b*, and 140*c* is configured to filter wavelength components of pieces of light incident on a respective light-sensing cell of the plurality of light-sensing cells 130*a*, 130*b*, and 130*c*. The plurality of light filters 140*a*, 140*b*, and 140*c* may be included in a single light filter layer 140. However, this is provided herein as an example, and the plurality of light filters 140*a*, 140*b*, and 140*c* may be included in separate light filter layers from one another. The light filters of the plurality of light filters 140*a*, 140*b*, and 140*c* may be prepared in correspondence to a respective light-sensing cell of the plurality of light-sensing cells 130*a*, 130*b*, and 130*c*. For example, a first light filter 140*a* may filter a wavelength of light incident on the first light-sensing cell 130*a*. Also, a second light filter 140*b* may filter a wavelength of light incident on the second light-sensing cell 130*b*. Also, a third light filter 140*c* may filter a wavelength of light incident on the third light-sensing cell 130*c*.

The first light filter 140*a* may allow only a predetermined wavelength component from incident light to transmit therethrough according to a wavelength selectivity of the first thin-lens 120*a*. For example, light of the first wavelength $\lambda_1$ from among incident light may transmit through the first light filter 140*a*, and the first light filter 140*a* may allow light of the remaining wavelength components to be reflected or absorbed. In the same manner, light of the second wavelength $\lambda_2$ from among incident light may transmit through the second light filter 140*b*, and the second light filter 140*b* may allow light of the remaining wavelength components to be reflected or absorbed. Also, light of the third wavelength $\lambda_3$ from among incident light may transmit through the third light filter 140*c*, and the third light filter 140*c* may allow light of the remaining wavelength components to be reflected or absorbed.

FIG. 8 shows an example of the light filters 140*a*, 140*b*, and 140*c* formed at locations where light incident on the thin lenses 120*a*, 120*b*, and 120*c* transmit therethrough. However, exemplary embodiments are not limited thereto. For example, the light filters 140*a*, 140*b*, and 140*c* may be formed between the thin lenses 120*a*, 120*b*, and 120*c* and the light-sensing layer 130. In this case, wavelengths of light transmitted through the light filters 140*a*, 140*b*, and 140*c* and the thin lenses 120*a*, 120*b*, and 120*c* may be filtered. In any cases, the light filters 140*a*, 140*b*, and 140*c* may filter wavelength components of light that is incident on the light-sensing cells 130*a*, 130*b*, and 130*c* of the light-sensing layer 130, respectively. Because the light filters 140*a*, 140*b*, and 140*c* filter wavelengths of incident light, a phenomenon of light of a wavelength band beyond the wavelength selectivity of each of the thin lenses 120*a*, 120*b*, and 120*c* (where, the phenomenon is also referred to as "optical crosstalk") may be prevented from being incident on the light-sensing cells 130*a*, 130*b*, and 130*c*. Also, quality of images obtained from the light-sensing cells 130*a*, 130*b*, and 130*c* may improve.

Figure 9:
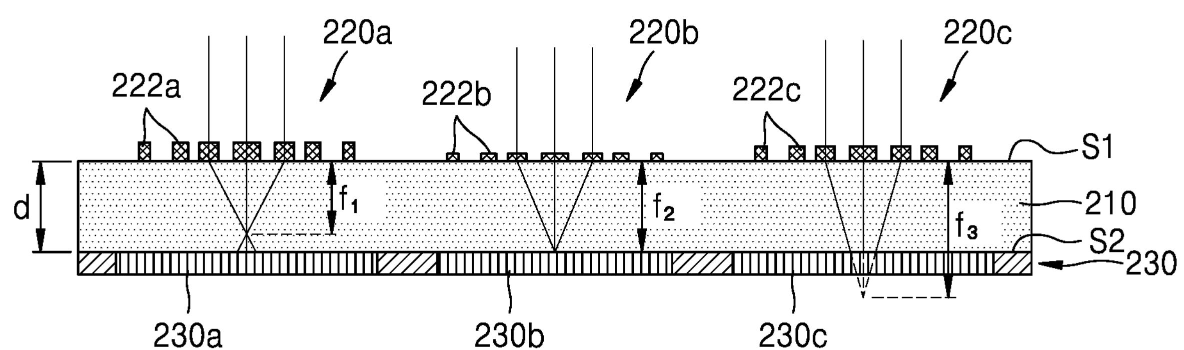
FIG. 9 is a view illustrating an image sensor according to another exemplary embodiment.

FIG. 9 is a view illustrating an image sensor according to another exemplary embodiment.

In FIG. 9, a repeated explanation of the same elements or operations as those in FIGS. 1 through 8 will not be given.

Referring to FIG. 9, the image sensor according to an exemplary embodiment may include a substrate 210, a plurality of thin lenses 220*a*, 220*b*, and 220*c* that are formed on a first surface S1 of the substrate 210 and concentrate pieces of light that are incident on the first surface S1, and a plurality of light-sensing cells 230*a*, 230*b*, and 230*c* that are formed on a second surface S2 facing the first surface S1 of the substrate 210 and generate electrical signals upon sensing light that has transmitted through the plurality of thin lenses 220*a*, 220*b*, and 220*c*.

The substrate 210 may include a transparent material. As used herein, the term "transparent material" denotes a material having a high light transmittance. For example, the substrate 210 may include at least one from among $Si_3N_4$, $SiO_2$, and a polymer such as PMMA or PDMS. Once a path of incident light changes by the thin lenses 220*a*, 220*b*, and 220*c*, the incident light may pass through the substrate 210 and be incident on a light sensing layer 230. The substrate 210, similar to an exemplary embodiment shown in FIG. 7, may include a plurality of sub-substrates.

Figure 10:
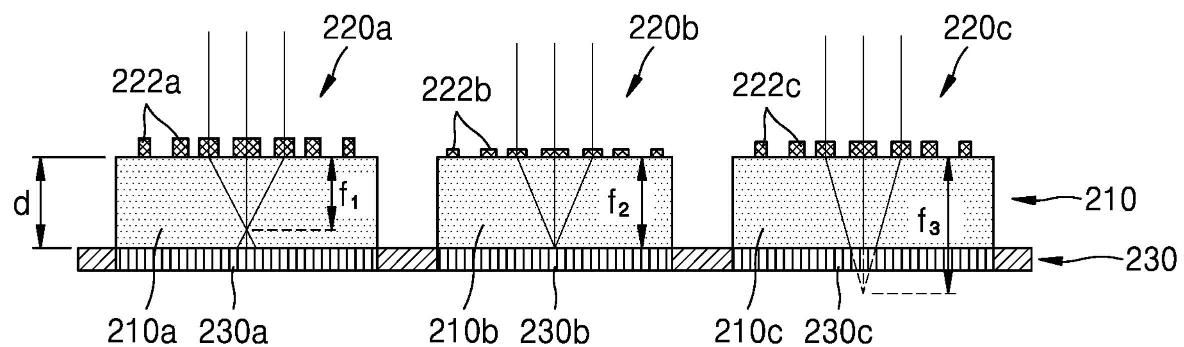
FIG. 10 is a view illustrating an image sensor including a substrate including a plurality of sub-substrates, according to an exemplary embodiment.

FIG. 10 is a view illustrating an example of the substrate 210 including a plurality of sub-substrates 210*a*, 210*b*, and 210*c*, according to an exemplary embodiment.

Referring to FIG. 10, the sub-substrates 210*a*, 210*b*, and 210*c* may be formed in correspondence to a respective thin lens of the plurality of thin lenses 220*a*, 220*b*, and 220*c* and a respective light-sensing cell of the plurality of light-sensing cells 230*a*, 230*b*, and 230*c*. For example, a first thin-lens 220*a* and a first light-sensing cell 230*a* may be formed on a first and second surface of a first sub-substrate 210*a*, respectively. Also, a second thin-lens 220*b* and a second light-sensing cell 230*b* may be formed on a first and second surface of a second sub-substrate 210*b*, respectively. Also, a third thin-lens 220*c* and a third light-sensing cell 230*c* may be formed on a first and second surface of a third sub-substrate 210*c*, respectively. When the substrate 210 is divided into the plurality of sub-substrates 210*a*, 210*b*, and 210*c*, interference between pieces of light that are incident on each of the light-sensing cells 130*a*, 130*b*, and 130*c* may be prevented.

The thin lenses 220*a*, 220*b*, and 220*c* may include a plurality of scatterers 222*a*, 222*b*, and 222*c*. At least two from among the thin lenses 220*a*, 220*b*, and 220*c* may be configured to concentrate pieces of the incident light on the light-sensing cells 230*a*, 230*b*, and 230*c* to have different focal lengths. For example, the first thin-lens 220*a* may concentrate pieces of the incident light to have a first focal length $f_1$ in a direction toward the first light-sensing cell 230*a*. Also, the second thin-lens 220*b* may concentrate pieces of the incident light to have a second focal length $f_2$ in a direction toward the second light-sensing cell 230*b*. Also, the third thin-lens 220*c* may concentrate pieces of the incident light to have a third focal length $f_3$ in a direction toward the third light-sensing cell 230*c*. This is provided herein as an example only, and exemplary embodiments are not limited thereto. For example, the first through third thin lenses 220*a*, 220*b*, and 220*c* do not necessarily have to concentrate pieces of incident light to have focal lengths that are all different from one another, and two from among the first through third thin lenses 220*a*, 220*b*, and 220*c* may concentrate pieces of incident light to have substantially the same focal length.

Descriptions of exemplary embodiments provided herein with reference to FIGS. 2 through 5 may apply to surfaces of the thin lenses 220*a*, 220*b*, and 220*c*. The scatterers 222*a*, 222*b*, and 222*c* included in the thin lenses 220*a*, 220*b*, and 220*c* may have pillar structures. The scatterers 222*a*, 222*b*, and 222*c* may have a shape of a cross-section of the pillar structure that may be from among a circle, an oval, a rectangle, and a square. Also, the scatterers 222*a*, 222*b*, and 222*c* may have a polygonal prism shape or a pillar structure with a cross-section having an "L"-like shape. Shapes of the scatterers 222*a*, 222*b*, and 222*c* may not have symmetricity in a direction. For example, a cross-section of the scatterers 222*a*, 222*b*, and 222*c* may have a shape that is not symmetrical in a horizontal direction as, for example, an oval shape. Also, when cross-sections of the scatterers 222*a*, 222*b*, and 222*c* differ according to its height, the shapes of the scatterers 222*a*, 222*b*, and 222*c* may be asymmetric with respect to the height.

Shapes of the scatterers 222*a*, 222*b*, and 222*c* may vary depending on focal lengths of the thin lenses 220*a*, 220*b*, and 220*c*. For example, scatterers 222*a* included in the first thin-lens 220*a* may have a shape appropriate to concentrate pieces of light to have a first focal length $f_1$. In one exemplary embodiment, a cross-sectional shape of the scatterers 222*a* and a ratio between a width and a height of the scatterers 122*a* may change. Also, scatterers 222*b* included in the second thin-lens 220*b* may have a shape appropriate to concentrate pieces of light to have a second focal length $f_2$. Also, scatterers 222*c* included in the third thin-lens 220*c* may have a shape appropriate to concentrate pieces of light to have a third focal length $f_3$. At least two from among the first through third focal lengths $f_1$, $f_2$, and $f_3$ may be different from each other. Also, interval distances among the scatterers 222*a*, 222*b*, and 222*c* and heights of the scatterers 222*a*, 222*b*, and 222*c* may differ according to focal lengths of the thin lenses 220*a*, 220*b*, and 220*c*.

When the focal lengths of the thin lenses 220*a*, 220*b*, and 220*c* change, images that are defocused to different degrees may be formed on the light-sensing cells 230*a*, 230*b*, and 230*c*. Defocusing degrees of the images formed on the light-sensing cells 230*a*, 230*b*, and 230*c* may differ according to the focal lengths of the thin lenses 220*a*, 220*b*, and 220*c* and distances between an object and the thin lenses 220*a*, 220*b*, and 220*c*. Therefore, when a defocusing degree for each position of an image measured by each of the light-sensing cells 230*a*, 230*b*, and 230*c* is compared with those of images measured by light-sensing cells and then extracted, distances between the thin lenses 220*a*, 220*b*, and 220*c* and the object and a 3-dimensional shape may be obtained.

Figure 11:
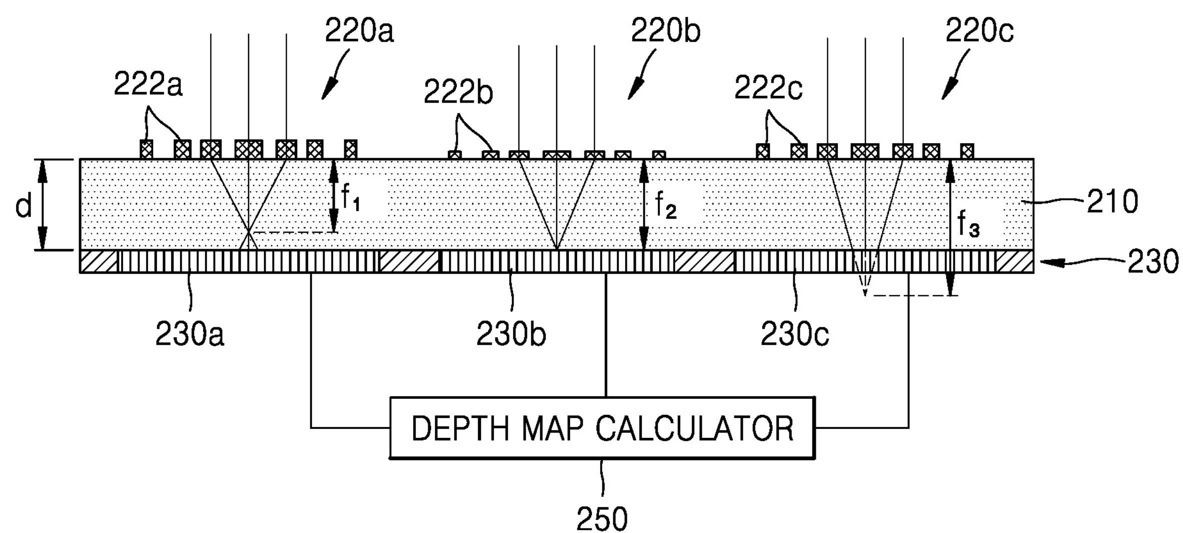
FIG. 11 is a view illustrating an image sensor according to an exemplary embodiment.

FIG. 11 is a view illustrating an image sensor according to an exemplary embodiment.

Referring to FIG. 11, the image sensor may further include a depth map calculator 250 that is configured to calculate depth map information of an image corresponding to incident light. The depth map calculator 250 may receive images measured by the light-sensing cells 230*a*, 230*b*, and 230*c*. Also, the depth map calculator 250 may recognize a relative blur degree for each position of the images measured by one from among the light-sensing cells 230*a*, 230*b*, and 230*c*. Also, the depth map calculator 250 may calculate a defocusing degree for each position of the images measured by one from among the light-sensing cells 230*a*, 230*b*, and 230*c*.

The depth map calculator 250 may calculate depth map information of an image corresponding to the incident light from the defocusing degree measured by each of the light-sensing cells 230*a*, 230*b*, and 230*c* and the focal length of each of the thin lenses 220*a*, 220*b*, and 220*c*. For example, the depth map calculator 250 may calculate a distance from each of a plurality of points on each of objects or a surface of an object included in the image to each of the thin lenses 220*a*, 220*b*, and 220*c*. In this regard, as the depth map calculator 250 calculates the depth map information, the image sensor may obtain a 3-dimensional image of the object.

The thin lenses 220*a*, 220*b*, and 220*c* may each concentrate pieces of light having a predetermined wavelength component. The thin lenses 220*a*, 220*b*, and 220*c* may function as an optical device with respect to a predetermined wavelength band of incident light. Shapes, a shape of arrangement, interval distances, and heights of the scatterers 222*a*, 222*b*, and 222*c* included in the thin lenses 220*a*, 220*b*, and 220*c* may be determined according to wavelength selectivity of the thin lenses 220*a*, 220*b*, and 220*c*.

For example, to output an image with one color, all the thin lenses 220*a*, 220*b*, and 220*c* may have substantially the same wavelength selectivity. The thin lenses 220*a*, 220*b*, and 220*c* may all concentrate light of substantially the same wavelength component. Also, shapes, a shape of arrangement, interval distances, and heights of the scatterers 222*a*, 222*b*, and 222*c* included in the thin lenses 220*a*, 220*b*, and 220*c* may be determined according to focal lengths of the thin lenses 220*a*, 220*b*, and 220*c*. Heights and interval distances of the scatterers 222*a*, 222*b*, and 222*c* may be smaller than a wavelength of light that is concentrated by the thin lenses 220*a*, 220*b*, and 220*c*.

Figure 12:
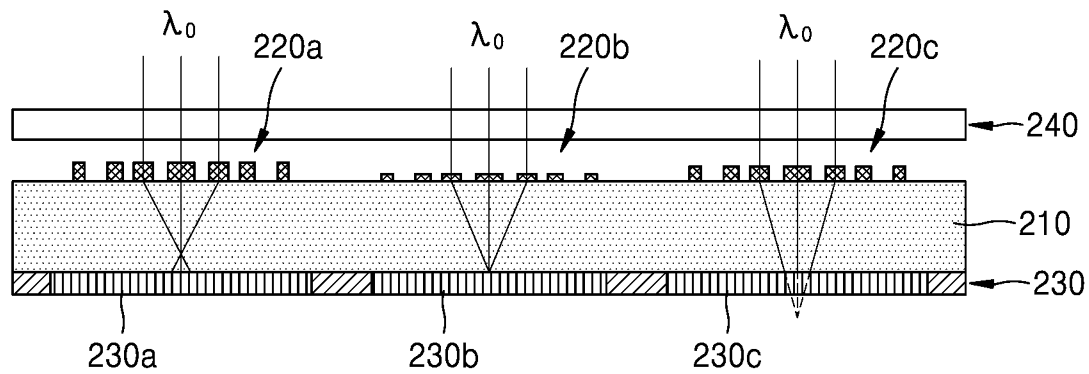
FIG. 12 is a view illustrating an image sensor according to an exemplary embodiment.

FIG. 12 is a view illustrating an image sensor according to an exemplary embodiment.

Referring to FIG. 12, the image sensor may include a light filter layer 240 that filters wavelength components of light incident on each of the light-sensing cells 230*a*, 230*b*, and 230*c*. Although the light filter layer 240 illustrated in FIG. 12 is prepared at a position where the light incident on the light-sensing cells 230*a*, 230*b*, and 230*c* travels, exemplary embodiments are not limited thereto. In one or more exemplary embodiments, the light filter layer 240 may be positioned between the thin lenses 220*a*, 220*b*, and 220*c* and the light sensing layer 230 including the light-sensing cells 230*a*, 230*b*, and 230*c*. The light filter layer 240 may allow a predetermined wavelength $\lambda_0$ component among the incident light to transmit therethrough and may reflect or absorb the remaining wavelength components. Because the light filter layer 240 filters the wavelengths of the incident light, noise light of undesired wavelengths may be prevented from being incident on the light-sensing cells 230*a*, 230*b*, and 230*c*. Also, quality of images obtained from the light-sensing cells 230*a*, 230*b*, and 230*c* may improve.

The thin lenses 220*a*, 220*b*, and 220*c* may each concentrate pieces of light having different wavelengths to have different focal lengths. For example, the first thin-lens 220*a* may concentrate light having a first wavelength $\lambda_1$ to have a first focal length $f_1$. The scatterers 222*a* included in the first thin-lens 220*a* may have a shape of arrangement and interval distances appropriate to concentrate pieces of light having the first wavelength $\lambda_1$ to have the first focal length $f_1$. Also, the second thin-lens 220*b* may concentrate light having a second wavelength $\lambda_2$ to have a second focal length $f_2$. The scatterers 222*b* included in the second thin-lens 220*b* may have a shape of arrangement and interval distances appropriate to concentrate pieces of light having the second wavelength $\lambda_2$ to have the second focal length $f_2$. Also, the third thin-lens 220*c* may concentrate light having a third wavelength $\lambda_3$ to have a third focal length $f_3$. The scatterers 222*c* included in the third thin-lens 220*c* may have a shape of arrangement and interval distances appropriate to concentrate pieces of light having the third wavelength $\lambda_3$ to have the third focal length $f_3$.

Heights and interval distances of the scatterers 222*a*, 222*b*, and 222*c* included in the thin lenses 220*a*, 220*b*, and 220*c* may vary according to wavelength selectivities of 220*a*, 220*b*, and 220*c*, respectively. For example, interval distances between the scatterers 222*a* and heights of the scatterers 222*a* in the first thin-lens 220*a* may be smaller than the first wavelength $\lambda_1$. Also, interval distances between the scatterers 222*b* and heights of the scatterers 222*b* in the second thin-lens 220*b* may be smaller than the second wavelength $\lambda_2$. Also, interval distances between the scatterers 222*c* and heights of the scatterers 222*c* in the third thin-lens 220*c* may be smaller than the third wavelength $\lambda_3$.

Figure 13:
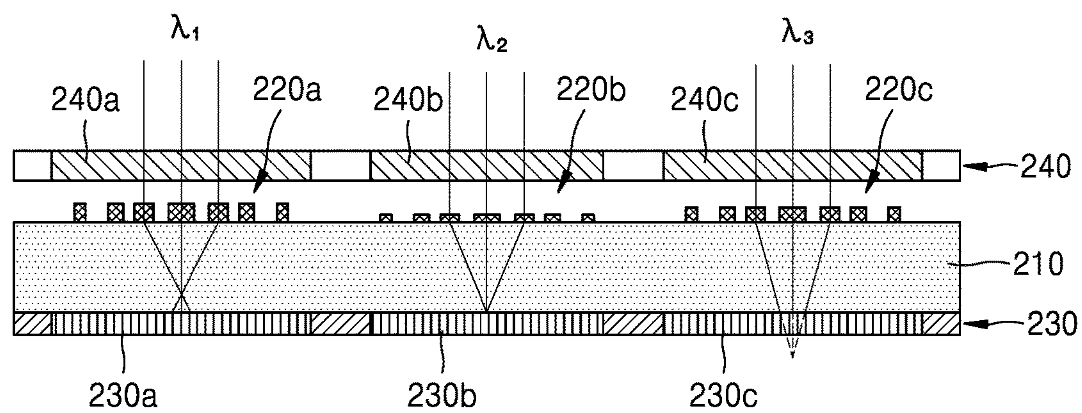
FIG. 13 is a view illustrating an image sensor according to an exemplary embodiment.

FIG. 13 is a view illustrating an image sensor according to an exemplary embodiment.

Referring to FIG. 13, the image sensor may include a light filter layer 240 configured to filter wavelength components of light incident on each of the light-sensing cells 230*a*, 230*b*, and 230*c*. The light filter layer 240 may include a plurality of light filters 240*a*, 240*b*, and 240*c*. The light filters 240*a*, 240*b*, and 240*c* may be applied in correspondence to the light-sensing cells 230*a*, 230*b*, and 230*c*. For example, a first light filter 240a may be configured to filter a wavelength of light incident on a first light-sensing cell 230a. Also, a second light filter 240b may be configured to filter a wavelength of light incident on a second light-sensing cell 230b. Also, a third light filter 240c may be configured to filter a wavelength of light incident on a third light-sensing cell 230c.

The first light filter 240a may transmit a predetermined wavelength component among incident light according to a wavelength selectivity of the first thin-lens 220a. For example, the first light filter 240a may allow light having a first wavelength $\lambda_1$ to transmit therethrough and reflect or absorb light of the remaining wavelength components. In the same manner, the second light filter 240b may allow light having a second wavelength $\lambda_2$ to transmit therethrough and reflect or absorb light of the remaining wavelength components. Also, the third light filter 240c may allow light having a third wavelength $\lambda_3$ to transmit therethrough and reflect or absorb light of the remaining wavelength components. Because the light filters 240a, 240b, and 240c filter wavelengths of incident light, noise light of undesired wavelengths may be prevented from being incident on the light-sensing cells 230a, 230b, and 230c. Also, quality of images obtained from the light-sensing cells 230a, 230b, and 230c may improve. Further, the light-sensing cells 230a, 230b, and 230c each generate images in different colors, and thus a multi-color image may be produced by synthesizing the images.

Figure 14:
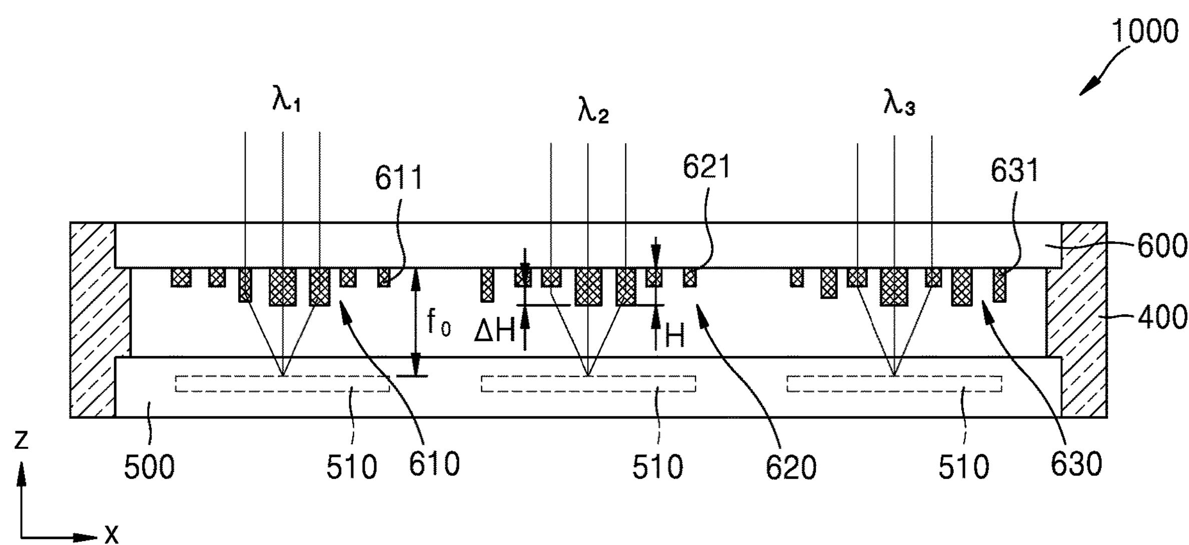
FIG. 14 is a cross-sectional view illustrating a schematic structure of an image sensor according to another exemplary embodiment.
Figure 15:
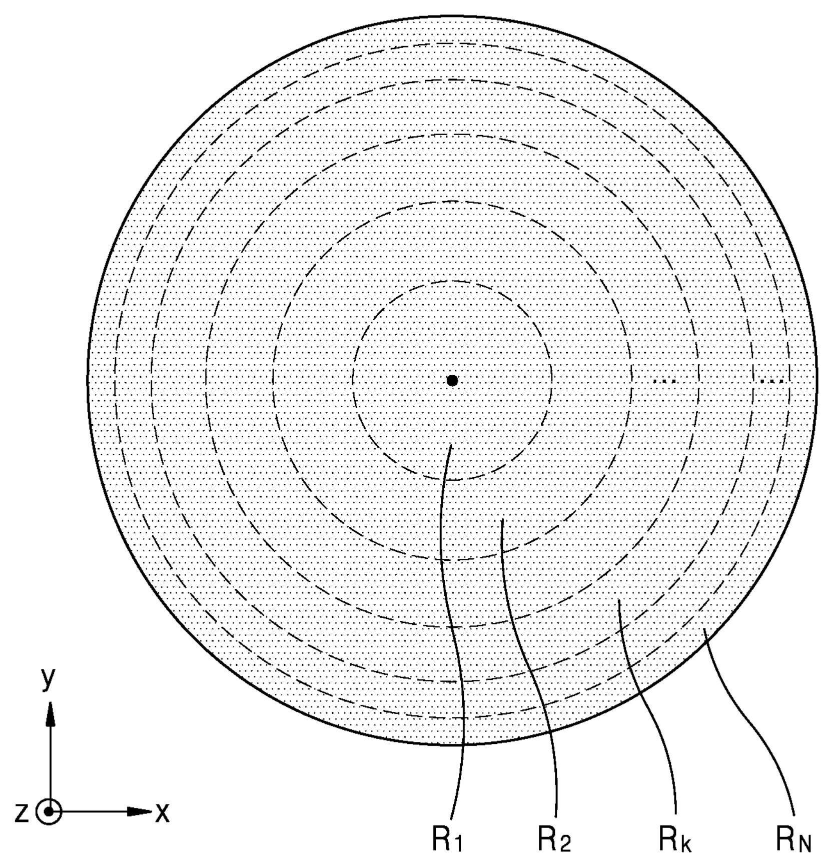
FIG. 15 is a view illustrating an example of the classification of regions related to the arrangement of scatterers provided in a thin lens of the image sensor of FIG. 14.
Figure 16:
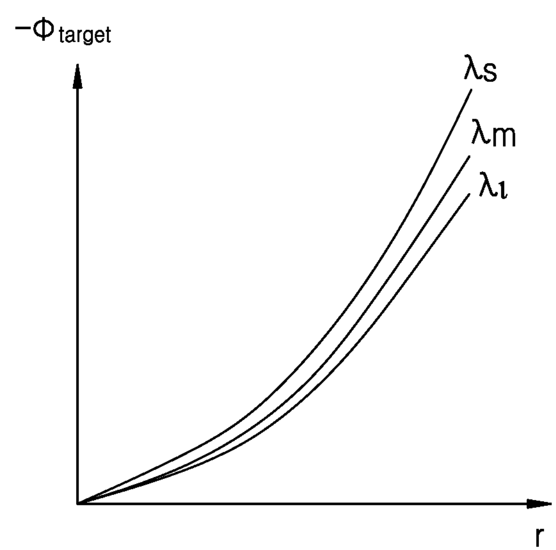
FIG. 16 is a graph conceptually showing a target phase for each wavelength to be satisfied by scatterers in each region of FIG. 14.

FIG. 14 is a cross-sectional view illustrating a schematic structure of an image sensor 1000 according to another exemplary embodiment. FIG. 15 is a view illustrating an example of the classification of regions related to the arrangement of scatterers provided in a thin lens of the image sensor of FIG. 14. FIG. 16 is a graph conceptually showing a target phase for each wavelength to be satisfied by scatterers in each region of FIG. 14.

Referring to FIG. 14, the image sensor 1000 may include a substrate 600, a first thin lens 610 disposed on the substrate 600, including a plurality of first scatterers 611, and concentrating light of a first wavelength $\lambda_1$, a second thin lens 620 including a plurality of second scatterers 621 formed on the substrate 600 and concentrating light of a second wavelength $\lambda_2$ that is different from the first wavelength $\lambda_1$, and a plurality of light-sensing cells 510 for sensing light that passed through the first thin lens 610 and the second thin lens 620. The image sensor 1000 may also include a third thin lens 630 including a plurality of third scatterers 631 formed on the substrate 600 and concentrating light of a third wavelength $\lambda_3$ that is different from the first wavelength $\lambda_1$ and the second wavelength $\lambda_2$. In this state, the first wavelength $\lambda_1$, the second wavelength $\lambda_2$, and the third wavelength $\lambda_3$ signify wavelengths in predetermined wavelength bands when the first to third thin lenses 610, 620, and 630 concentrate light of the predetermined wavelength bands.

The first wavelength $\lambda_1$, the second wavelength $\lambda_2$, and the third wavelength $\lambda_3$ may be wavelengths in a red wavelength band, a green wavelength band, and a blue wavelength band, respectively, and the first to third thin lenses 610, 620, and 630 may concentrate light of a red wavelength band, light of a green wavelength band, and light of a blue wavelength band, respectively. Accordingly, the image sensor 1000 may obtain color image information included in incident light.

The first scatterers 611, the second scatterers 621, and the third scatterers 631 may include a material having a refractive index higher than the substrate 600 and may include a material as described in FIGS. 2 to 5. The first scatterers 611, the second scatterers 621, and the third scatterers 631 may have a column shape having various sectional shapes having a shape dimension of a sub-wavelength, having an arrangement interval of a sub-wavelength, and a shape distribution for concentrating light of a predetermined wavelength. The first scatterers 611, the second scatterers 621, and the third scatterers 631 may have shape distributions different from one another to concentrate light of wavelengths different from one another. The "sub-wavelength" may signify a wavelength less than a wavelength in a wavelength band of light concentrated by a thin lens including the respective scatterers. Furthermore, the "shape distribution" collectively refers to a shape, a size, an arrangement rule, and a distribution thereof by locations. Furthermore, the "shape distributions different from one another" means that at least one of a shape, a size, an arrangement rule, and a distribution thereof by locations is different from the rest.

In the present embodiment, at least two of the first scatterers 611 may have different heights to each other. Alternatively, at least two of the second scatterers 621 may have different heights to each other. Alternatively, at least two of the third scatterers 631 may have different heights to each other.

A height difference $\Delta H$ of at least two of the first scatterers 611 may be equal to or less than $2\lambda_1$ with respect to the first wavelength $\lambda_1$. A height H of the first scatterers 611 may be in a range that $\lambda_1/2 \leq H \leq 3\lambda_1$. The height difference $\Delta H$ of at least two of the second scatterers 621 may be equal to or less than $2\lambda_2$ with respect to the second wavelength $\lambda_2$. A height H of the second scatterers 621 may be in a range that $\lambda_2/2 \leq H \leq 3\lambda_2$. The height difference $\Delta H$ of at least two of the third scatterers 631 may be equal to or less than $2\lambda_3$ with respect to the third wavelength $\lambda_3$. The height H of the third scatterers 631 may be in a range that $\lambda_3/2 \leq H \leq 3\lambda_3$.

The first scatterers 611, the second scatterers 621, and the third scatterers 631 may include a material having a refractive index higher than a refractive index of the material of the substrate 600. Accordingly, it is advantageous to implement desired focal length and transmittance in concentrating incident light. A difference between the refractive indexes of the first scatterers 611, the second scatterers 621, the third scatterers 631 and the refractive index of the substrate 600 may be, for example, 2 or more.

The image sensor 1000 may further include a housing 400 that keep a predetermine interval between the first thin lens 611 and the light-sensing cells 510. The predetermined interval may be determined considering a focal length $f_0$ of the first thin lens 611. The housing 400, as illustrated in the drawing, may fix both side portions of the substrate 600 where the first scatterers 611 are formed and a sensor substrate 500 including the light-sensing cells 510. However, this is merely exemplary, and as in the above-described embodiments, the first to third thin lenses 610, 620, and 630 may be formed on one surface of the substrate 600 and the light-sensing cells 510 may be formed on the other surface thereof.

As the scatterers have different heights to each other, dispersion according to chromatic aberration, that is, a wavelength, may be freely adjusted in concentrating light of a predetermined wavelength band. For example, light of the first wavelength $\lambda_1$, the second wavelength $\lambda_2$, and the third wavelength $\lambda_3$ respectively concentrated by the first thin lens 610, the second thin lens 620, and the third thin lens 630 may each have a predetermined bandwidth. Dispersion may exist according to a change of a wavelength in a bandwidth, and adjustment of a desired dispersion may be implemented by a height variation of the scatterers.

To have refractive power to incident light of a predetermined wavelength, when the shape of the first scatterers 611 (or the second scatterers 621 or the third scatterers 631) provided in the first thin lens 610 (or the second thin lens 620 or the third thin lens 630) is determined and arranged, the classification of regions as illustrated in FIG. 15 may be used. In each of a plurality of regions $R_1, R_2, \ldots R_k, \ldots R_N$, as a region to which a predetermined rule regarding the size and arrangement of the first scatterers 611, the second scatterers 621, or the third scatterers 631, a target phase $\varphi_{target}$ of FIG. 16 may be set for each region. The target phase $\varphi_{target}$ may be set to indicate a phase change range of $2\pi$ with respect to a central wavelength $\lambda_m$ in a given region of FIG. 15, and thus the regions $R_1, R_2, \ldots, R_k, \ldots R_N$ may be referred to as the "$2\pi$ zone". In the vertical axis of the graph of FIG. 16, the negative (−) sign is shown as an example of being a phase for indicating positive refractive power.

The target phase $\varphi_{target}$, as illustrated in FIG. 16, appears to be slightly different with respect to light of wavelengths $\lambda_l$, $\lambda_m$, and $\lambda_s$ different from one another. To implement desired target phase with respect to light of a predetermined wavelength, a rule regarding the shape, size, or arrangement of the first scatterers 611 arranged in a plurality of $2\pi$ zones may be determined. In the following description, an expression "shape distribution" may be used together as one meaning the "shape, size, or arrangement". A degree of a change in the target phase $\varphi_{target}$ to the light of wavelengths different from each other relates to a dispersion $\Delta\varphi$, and a wavelength range including exampled wavelengths $\lambda_l$, $\lambda_m$, and $\lambda_s$ relates to a bandwidth BW. A shape condition of each of the first scatterers 611 that may implement the dispersion $\Delta\varphi$ in a desired range with respect to a desired bandwidth BW may be set from a prepared phase-dispersion map. The phase-dispersion map may be typically created by a method of marking a shape condition of the first scatterers 611 at a position corresponding to the phase and dispersion at the central wavelength by various combinations of a width and a pitch thereof while setting the first scatterers 611 at a constant height. A design dimension that shows desired performance at a desired position may be selected from the map. When the height variation is introduced, height conditions may overlap each other as a plurality of phase-dispersion maps are set, that is, a range of selecting the shape of the first scatterers 611 may increase. As such, the shape and arrangement of the first scatterers 611 may be determined to increase a concentrating wavelength band and freely adjust chromatic aberration. The above description may be applied to the second scatterers 621 of the second thin lens 620 and the third scatterers 631 of the third thin lens 630 in the design of a wavelength band including the second wavelength $\lambda_2$ and the third wavelength $\lambda_3$.

Although, in FIG. 14, the height H, the width w, and the pitch p of the first scatterers 611, the second scatterers 621, and the third scatterers 631 are randomly illustrated, this is merely for convenience of explanation, and the disclosure is not limited thereto. For example, as illustrated in FIG. 15, a predetermined rule may be set and applied not only to the width or the pitch, but also to the height in a region. Furthermore, although, in FIG. 14, the scatterers having different heights to each other are applied to all of the first thin lens 610, the second thin lens 620, and the third thin lens 630, this is merely exemplary, and the height variation may be applied to some lenses only.

Figure 17:
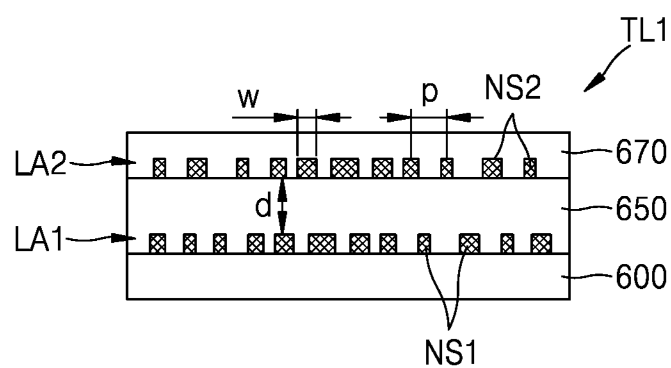
FIG. 17 is a cross-sectional view illustrating a schematic structure of a thin lens that may be provided in an image sensor according to another exemplary embodiment.

FIG. 17 is a cross-sectional view illustrating a schematic structure of a thin lens TL1 that may be provided in an image sensor according to another exemplary embodiment.

The thin lens TL1 according to the present embodiment is different from the thin lens provided in the image sensor according to the above-described embodiments in that the lower and upper scatterers NS1 and NS2 are arranged in double layer structure.

A plurality of the lower scatterers NS1 formed on the substrate 600 form a first layer LA1, and a plurality of upper scatterers NS2 formed on a low refractive index material layer 650 that covers the lower scatterers NS1 form a second layer LS2. The low refractive index material layer 650 may include a material having a refractive index lower than a refractive index of the lower scatterers NS1. Furthermore, a low refractive index material layer 670 having a refractive index lower than a refractive index of the upper scatterers NS2 may be further formed on the upper scatterers NS2 to protect the upper scatterers NS2. The low refractive index material layer 670 covering the upper scatterers NS2 may be omitted.

The lower scatterers NS1 and the upper scatterers NS2 may face each other to be misaligned with each other. This means that the center axes of at least some of the lower scatterers NS1 and the upper scatterers NS2 vertically facing each other may be misaligned with each other. Also, it is not limited to that all of the lower scatterers NS1 and the upper scatterers NS2 face each other to be misaligned with each other.

An interval d between the lower scatterer NS1 and the upper scatterer NS2, which are adjacent to each other, among the lower scatterers NS1 and the upper scatterers NS2, that is, a separation distance in a height direction, may be greater than $\lambda/2$ with respect to the wavelength $\lambda$ within the predetermined wavelength band of light concentrated by the thin lens TL1.

The arrangement of the lower and upper scatterers NS1 and NS2 in a multilayer is to reduce deterioration of performance that may occur at some positions even when the shape of each scatter is set to a desired target phase. In this regard, a description is presented with reference to FIGS. 15, 16, and 18 to 20.

Figure 18:
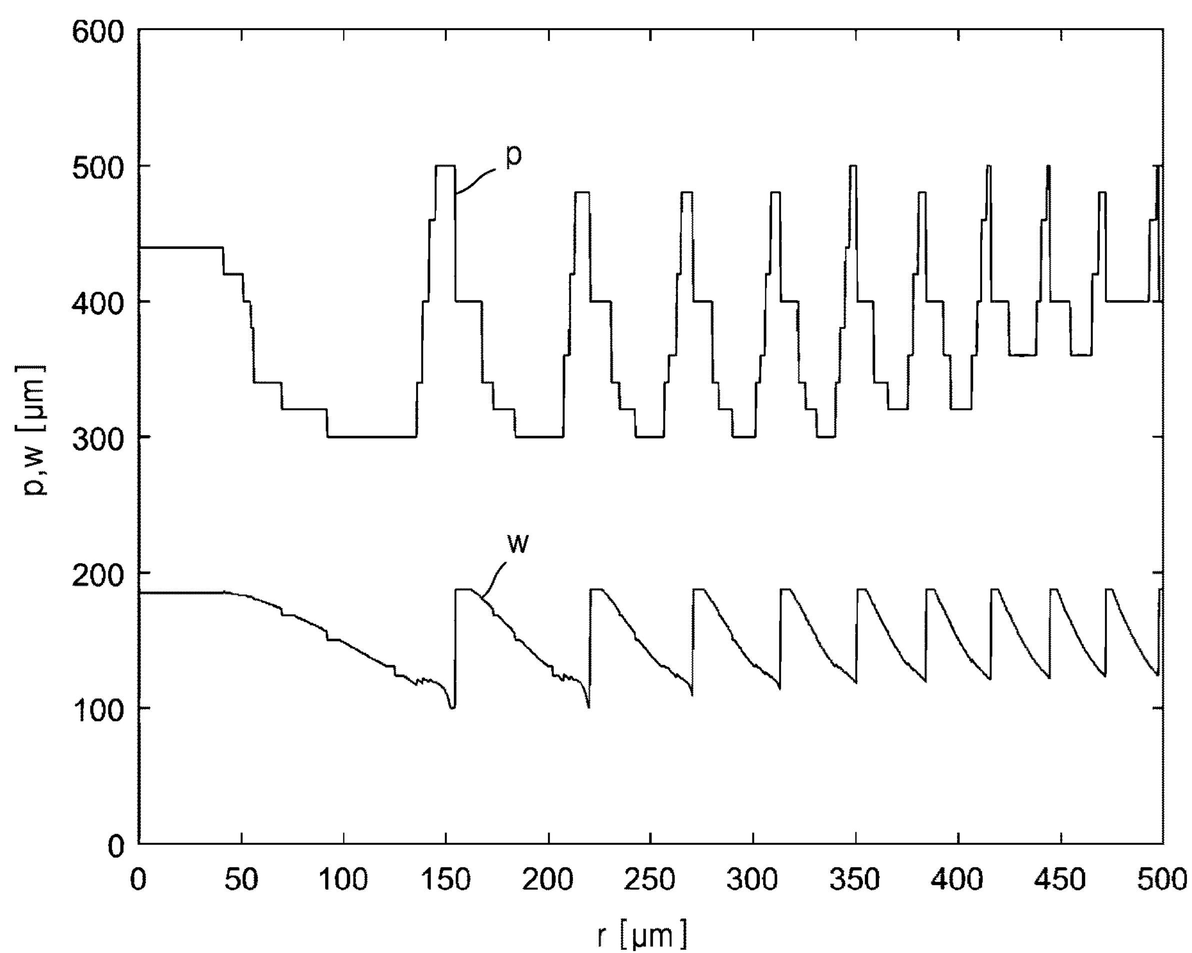
FIG. 18 illustrates an example of design data of width and pitch by locations of scatterers arranged in a first layer of the thin lens of FIG. 17.

The classification of regions as in FIG. 15 and the target phase in each region illustrated in FIG. 16 may be applied to the thin lens TL1 of FIG. 17. In other words, the sizes and arrangement of the lower scatterers NS1 and the upper scatterers NS2 arranged in the first layer LA1 and the second layer LA2 of the thin lens TL1 may be set to satisfy the target phase as in FIG. 16 for each region. FIG. 18 illustrates an example of design data of the width w and the pitch p by locations of the lower scatterers NS1 arranged in the first layer LA1 of the thin lens TL1 of FIG. 17.

Figure 19:
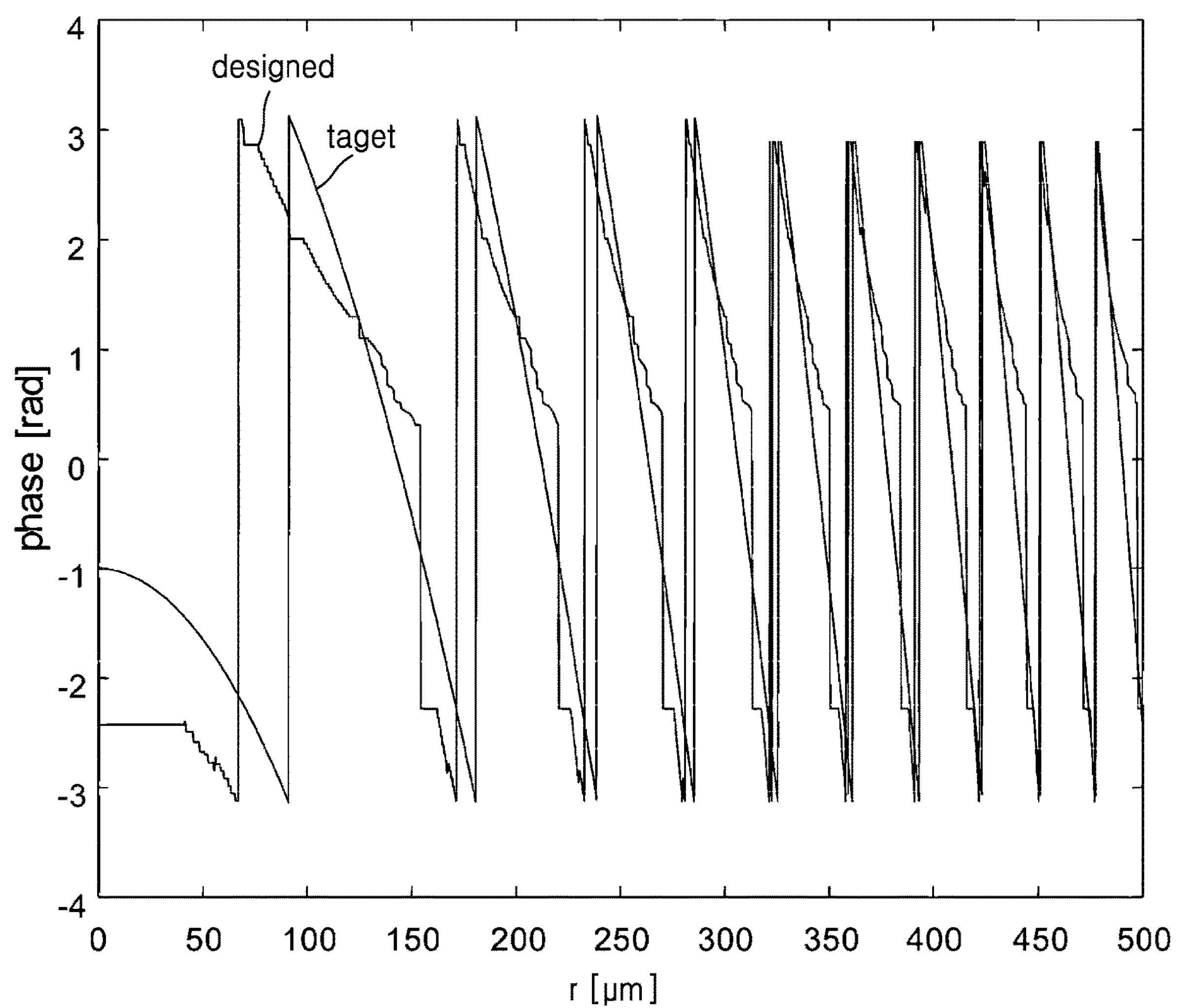
FIG. 19 is a graph of a comparison between a target phase value and a phase value by scatterers designed as in FIG. 18.

FIG. 19 is a graph of a comparison between a target phase value and a phase value by the scatterers designed as in FIG. 18. In the graph, a target phase value graph is indicated by "target", and a phase value graph by the scatterers designed to implement the target phase is indicated by "designed". In the graph, the two graphs are not completely congruous with each other and have an error. Furthermore, a degree of mismatch appears to vary according to the position.

Figure 20:
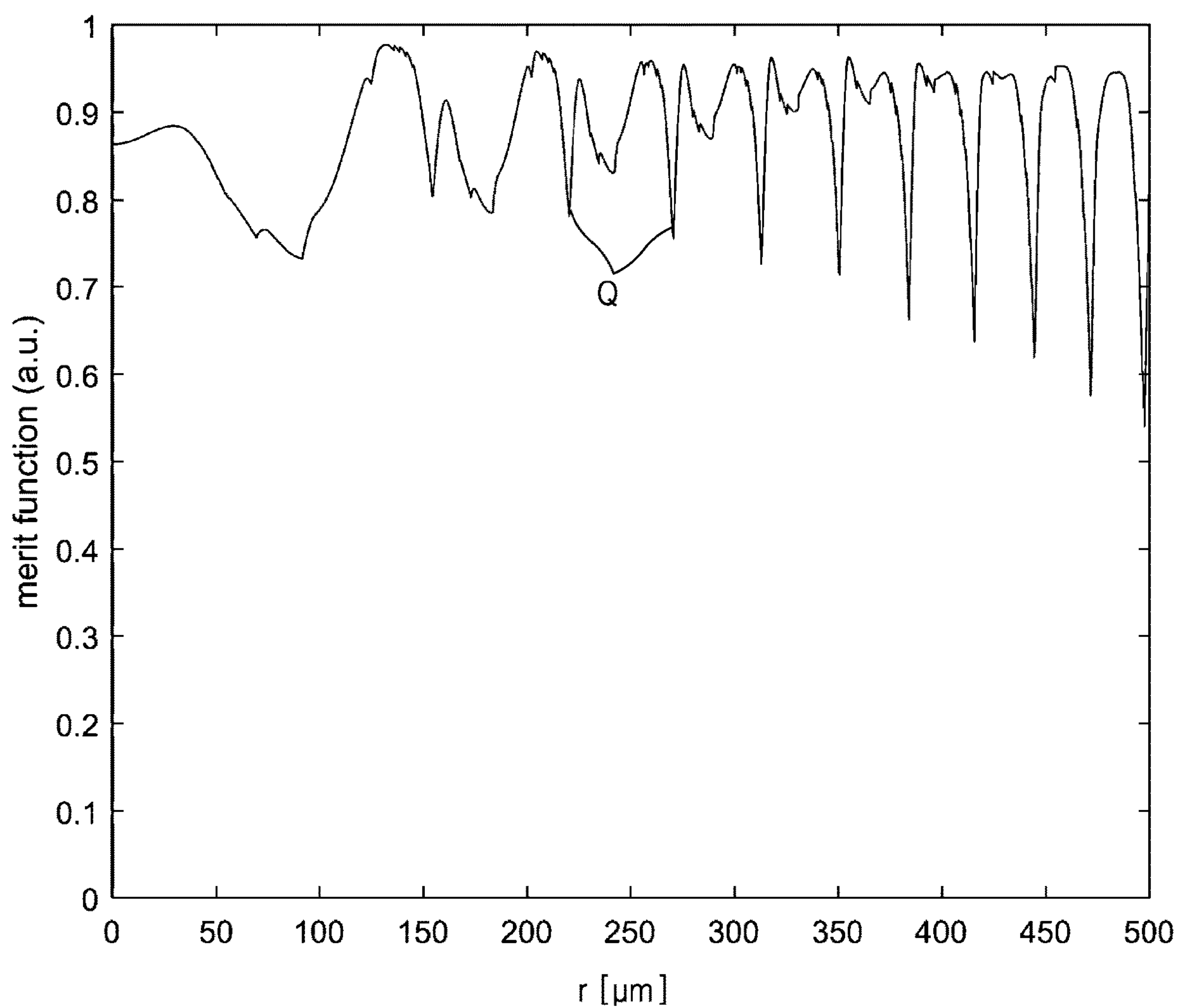
FIG. 20 is a graph of a performance index obtained by quantifying a difference between a target value and a design value in FIG. 19.

FIG. 20 is a graph of a performance index obtained by quantifying a difference between the target value and the design value in FIG. 19. The performance index is obtained such that correlation degree between a target transmissivity (transmission intensity and transmission phase) and an actual transmissivity in an entire wavelength band to be considered is integrated and quantified by locations in a radial direction. The graph may be referred to as the "merit function". The correlation degree is good as a value on the vertical axis of the graph is close to 1, and a position where the correlation degree is the lowest may be known from points Q indicating the lower extreme points.

FIGS. 18 to 20 illustrate the design data of the first layer LA1, and as multiple layers are introduced, correlation properties that are non-uniformly low may be compensated. For example, the rule regarding the size and arrangement of the upper scatterers NS2 forming the second layer LA2 may be determined such that, as illustrated in FIG. 20, a position where correlation is low in the first layer LA1, for example, the extreme point Q, may be moved to another position. By making the position where correlation is low appear to be different in the first layer LA1 and the second layer LA2 and overlapping dispersion and phase features of each layer, when desired light of a predetermined wavelength band is to be concentrated while maintaining dispersion in an appropriate range, performance deterioration that may occur at some particular positions may be reduced.

The shape distribution of the lower scatterers NS1 provided in the first layer LA1 and the shape distribution of the upper scatterers NS2 provided in the second layer LA2 may be determined to have different distributions of performance indexes by locations from each other. The shape distribution of the lower scatterers NS1 provided in the first layer LA1 and the shape distribution of the upper scatterers NS2 provided in the second layer LA2 may be determined such that degree of non-uniformity of focusing performance by the respective shape distributions are different from each other. The shape distribution of the lower scatterers NS1 provided in the first layer LA1 and the shape distribution of the upper scatterers NS2 provided in the second layer LA2 may be determined such that degree of non-uniformity of focusing performance by locations in each layer may be compensated for by each other. Any one of the first layer LA1 and the second layer LA2 may be set to alleviate the non-uniformity of focusing performance by the other layer.

As in the embodiment, when the scatterers are arranged in multiple layers in the thin lens TL1, the number of "2π zones" to which a rule of a predetermined unit is applied may be reduced. The number of 2π zones $R_1, R_2, \ldots, R_k, \ldots, R_N$ as illustrated in FIG. 15 may be set to a level appropriate to achieve a desired refractive power, and the number of regions increases for high refractive power. By using the multilayer arrangement, the number of regions formed in a radial direction may be reduced.

Although the number of multiple layers is set to, for example, two, the present disclosure is not limited thereto. For example, three or more layers may be selected. When the number of multiple layers is LN, the number of 27 zones formed in the radial direction may be reduced to 1/LN. Furthermore, the dispersion range may be reduced to 1/LN.

Figure 21:
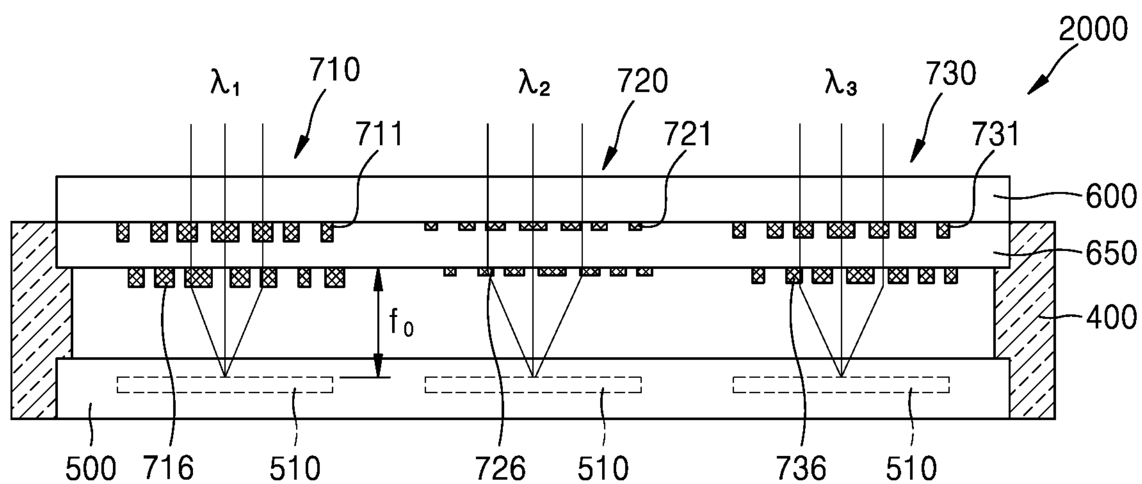
FIG. 21 is a cross-sectional view illustrating a schematic structure of an image sensor according to another exemplary embodiment.

FIG. 21 is a cross-sectional view illustrating a schematic structure of an image sensor 2000 according to another exemplary embodiment.

Referring to FIG. 21, the image sensor 2000 may include the light-sensing cells 510 and a first thin lens 710, a second thin lens 720, and a third thin lens 730 which are arranged to face the light-sensing cells 510. In the image sensor 2000 according to the present embodiment, the thin lens TL1 having the structure of FIG. 17 is applied to each of the first thin lens 710, the second thin lens 720, and the third thin lens 730, which concentrate light of wavelengths different from each other.

The first thin lens 710 for concentrating the light of the first wavelength $\lambda_1$ may include a plurality of first scatterers 711 and a plurality of second scatterers 716. The first scatterers 711 and the second scatterers 716 are arranged to form layers different from each other. The low refractive index material layer 650 covering the first scatterers 711 formed on the substrate 600 may be formed, and the second scatterers 716 may be formed on the low refractive index material layer 650.

The second thin lens 720 for concentrating the light of the second wavelength $\lambda_2$ that is different from the first wavelength $\lambda_1$ may include a plurality of third scatterers 721 disposed on the substrate 600 and including a material having a refractive index higher than the refractive index of the substrate 600 and a plurality of fourth scatterers 726 arranged spaced apart from the third scatterers 721, forming a layer different from the third scatterers 721.

The third thin lens 730 for concentrating the light of the third wavelength $\lambda_3$ that is different from the first wavelength $\lambda_1$ and the second wavelength $\lambda_2$ may include a plurality of fifth scatterers 731 disposed on the substrate 600 and including a material having a refractive index higher than the refractive index of the substrate 600 and a plurality of sixth scatterers 736 arranged spaced apart from the fifth scatterers 731 forming a layer different from the fifth scatterers 731.

As the scatterers provided in the first to third thin lenses 710, 720, and 730 are arranged in a multilayer structure, each of the first to third thin lenses 710, 720, and 730 may easily implement appropriate dispersion performance when concentrating light of a desired wavelength band.

Figure 22:
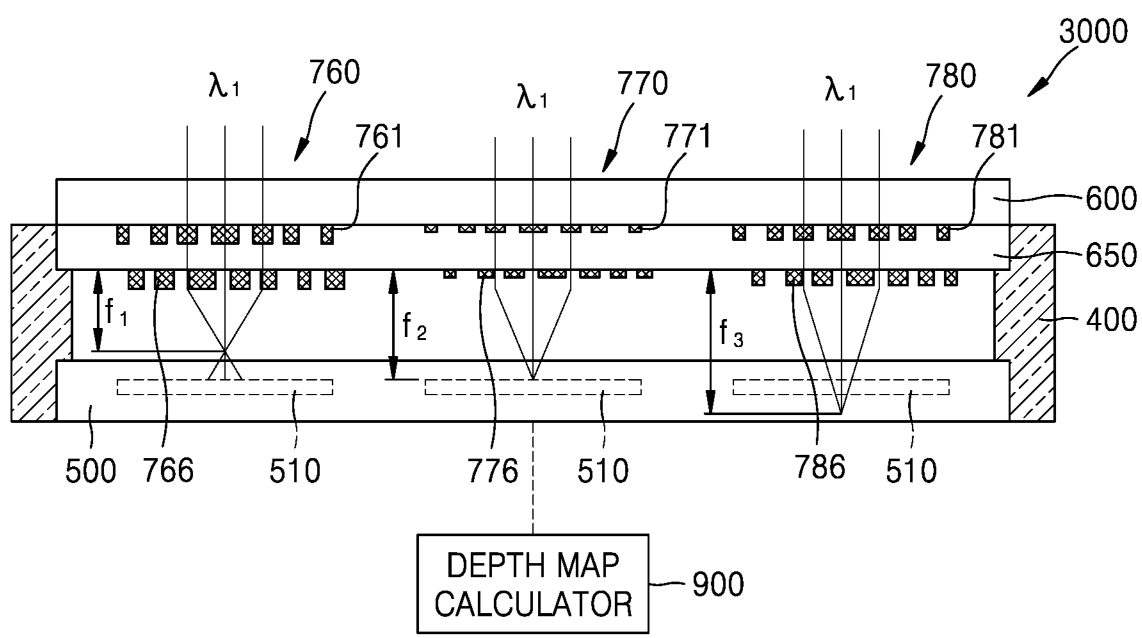
FIG. 22 is a cross-sectional view illustrating a schematic structure of an image sensor according to another exemplary embodiment.

FIG. 22 is a cross-sectional view illustrating a schematic structure of an image sensor 3000 according to another exemplary embodiment.

Referring to FIG. 22, the image sensor 3000 may include the light-sensing cells 510 and a first thin lens 760, a second thin lens 770, and a third thin lens 780 which are arranged to face the light-sensing cells 510. In the image sensor 3000 according to the present embodiment, the thin lens TL1 having the structure of FIG. 17 is applied to each of the first thin lens 760, the second thin lens 770, and the third thin lens 780, which concentrate light of wavelengths different from each other.

The image sensor 3000 according to the present embodiment is different from the image sensor 2000 of FIG. 17 in that the first thin lens 760, the second thin lens 770, and the third thin lens 780 each may concentrate light of the same wavelength band with different focal lengths.

The first thin lens 760 may include a plurality of first scatterers 761 and a plurality of second scatterers 766. The first scatterers 761 and the second scatterers 766 are arranged to form layers different from each other. The low refractive index material layer 650 covering the first scatterers 761 formed on the substrate 600 may be formed, and the second scatterers 716 may be formed on a low refractive index material layer 750. The first scatterers 761 and the second scatterers 766 have a shape distribution for concentrating the light of the first wavelength $\lambda_1$ with a focal length $f_1$.

The second thin lens 770 may include a plurality of third scatterers 771 disposed on the substrate 600 and including a material having a refractive index higher than the refractive index of the substrate 600 and a plurality of fourth scatterers 776 arranged on the low refractive index material layer 650 covering the third scatterers 771 forming a layer different from the third scatterers 771. The third scatterers 771 and the fourth scatterers 776 have a shape distribution for concentrating the light of the first wavelength $\lambda_1$ with a focal length $f_2$.

The third thin lens 780 may include a plurality of fifth scatterers 781 disposed on the substrate 600 and including a material having a refractive index higher than the refractive index of the substrate 600 and a plurality of sixth scatterers 786 arranged on the low refractive index material layer 650 that covers the fifth scatterers 781, forming a layer different from the fifth scatterers 781. The fifth scatterers 781 and the sixth scatterers 786 have a shape distribution for concentrating the light of the first wavelength $\lambda_1$ with a focal length $f_3$.

The regions as in FIG. 15 may be provided when the scatters included in each of the first thin lens 760, the second thin lens 770, and the third thin lens 780 are arranged. In other words, each of the first thin lens 760, the second thin lens 770, and the third thin lens 780 may include regions in which a phase modulation in a predetermined range is repeated. In this state, the number of regions may be related to refractive power. As the number of regions increases, high refractive power (short focal length) may be obtained. The first thin lens 760, the second thin lens 770, and the third thin lens 780, which implement different focal lengths of $f_1$, $f_2$, and $f_3$ with light of the same wavelength, may have different numbers of regions.

The image sensor 3000 may further include a depth map calculator 900 for calculating a defocusing degree of light concentrated by the first thin lens 760, the second thin lens 770, and the third thin lens 780 with focal lengths different from one another and incident on the light-sensing cells 510, and calculating depth map information of an image formed by the incident light from the calculated defocusing degree. Accordingly, the image sensor 3000 may obtain depth information of an image included in the incident light.

Although the image sensor 3000 is illustrated to include thin lenses for concentrating the light of the first wavelength $\lambda_1$ with different focal lengths of $f_1$, $f_2$, and $f_3$, this is merely exemplary. Additionally, thin lenses that concentrate the light of the second wavelength $\lambda_2$ that is different from the first wavelength $\lambda_1$, with different focal lengths $f_1$, $f_2$, and $f_3$, may be further provided.

Figure 23:
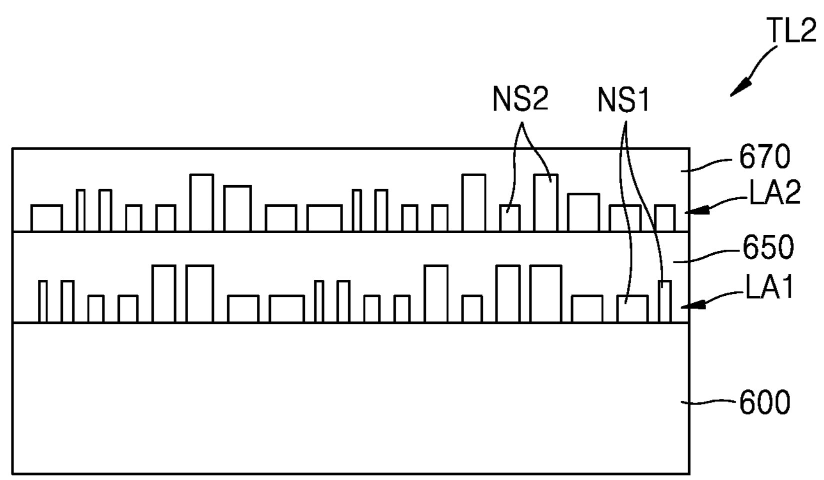
FIG. 23 is a cross-sectional view illustrating a schematic structure of a thin lens that may be provided in an image sensor according to another exemplary embodiment.

FIG. 23 is a cross-sectional view illustrating a schematic structure of a thin lens that may be provided in an image sensor according to another exemplary embodiment.

In the present embodiment, the lower scatterers NS1 forming the first layer LA1 of a thin lens TL2 may have at least two different heights to each other. Furthermore, the upper scatterer NS2 forming the second layer LA2 of the thin lens TL2 may have at least two different heights to each other. As described in the embodiment of FIG. 14, by applying height variation to each layer, a design value to implement appropriate phase and dispersion at each position may be easy. In particular, when the multilayer scatterer arrangement is introduced to compensate for the deterioration of performance of each layer, the selection of a design value of a scatterer to mutually compensate for the deterioration of performance of one layer in another layer corresponding to a low correlation position may be easier. Furthermore, effective compensation of the phase and the dispersion performance between layers may be possible.

Although the drawing illustrates that the lower and upper scatterers NS1 and NS2 having various heights are applied to both of the first layer LA1 and the second layer LA2, this is merely exemplary and the present disclosure is not limited thereto. For example, the scatterers may be arranged with a constant height in one of the first layer LA1 and the second layer LA2, and the scatterers having a different height may be selected in the other layer at an appropriately position as necessary.

The thin lens TL2 may be applied to the image sensors 2000 and 3000 of FIGS. 21 and 22. Accordingly, a desired focal length and appropriate dispersion performance may be implemented with respect to light of a desired wavelength.

As described above, according to the one or more of the above exemplary embodiments, an image sensor has been described with reference to FIGS. 1 through 13. The image sensor may concentrate pieces of incident light by using a plurality of thin lenses. In this regard, a size of the image sensor may be reduced. Also, at least one from among a plurality of operation characteristics of the thin lenses may be controlled by changing at least one from among shapes, a shape of arrangement, interval distances, and sizes of the thin lenses. Therefore, the image sensor may be easily manufactured. In addition, a 3-dimensional image, a multi-color image, and depth map information of an object may be easily obtained from imaged generated from a plurality of light-sensing cells.

The foregoing exemplary embodiments are examples and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An image sensor comprising:

a substrate;

a first thin lens configured to concentrate light of a first wavelength and comprising a plurality of first scatterers disposed on the substrate;

a second thin lens configured to concentrate light of a second wavelength, and comprising a plurality of second scatterers disposed on the substrate; and a plurality of light-sensing cells configured to sense the light concentrated by the first thin lens and the second thin lens, wherein at least two of the plurality of first scatterers or at least two of the plurality of second scatterers have different heights to each other.

2. The image sensor of claim 1, wherein a height difference between the at least two of the plurality of first scatterers is equal to or less than $2\lambda_1$ with respect to the first wavelength $\lambda_1$.

3. The image sensor of claim 1, wherein a height H of the plurality of first scatterers is in a range that $\lambda_1/2 \le H \le 3\lambda_1$ with respect to the first wavelength $\lambda_1$.

4. The image sensor of claim 1, wherein a height difference between the at least two of the second scatterers is equal to or less than $2\lambda_2$ with respect to the second wavelength $\lambda_2$.

5. The image sensor of claim 1, wherein a height H of the plurality of second scatterers is in a range that $\lambda_2/2 \le H \le 3\lambda_2$ with respect to the second wavelength $\lambda_2$.

6. The image sensor of claim 1, further comprising a low refractive index material layer covering the plurality of first scatterers, wherein the first thin lens further comprises a plurality of third scatterers disposed on the low refractive index material layer.

7. The image sensor of claim 6, wherein the plurality of first scatterers and the plurality of third scatterers face each other to be misaligned with each other.

8. The image sensor of claim 6, wherein a separation distance in a height direction between a first scatterer and a third scatterer, which are adjacent to each other, among the plurality of first scatterers and the plurality of third scatterers is greater than $\lambda_1/2$ with respect to the first wavelength $\lambda_1$.

9. The image sensor of claim 6, wherein a shape distribution of the plurality of first scatterers and a shape distribution of the plurality of third scatterers are determined to have different distributions of performance indexes by locations from each other.

10. The image sensor of claim 6, wherein a shape distribution of the plurality of first scatterers and a shape distribution of the plurality of third scatterers are determined to compensate for non-uniformity of focusing performance by locations.

11. The image sensor of claim 6, wherein heights of at least two of the plurality of third scatterers are different from each other.

12. The image sensor of claim 6, wherein the low refractive index material layer covers the plurality of second scatterers, and the second thin lens further comprises a plurality of fourth scatterers disposed on the low refractive index material layer.

13. The image sensor of claim 12, wherein at least two of the plurality of fourth scatterers have different heights to each other.

14. The image sensor of claim 1, wherein the first thin lens concentrates light of the first wavelength with a first focal length, and the second thin lens concentrates light of the second wavelength with the first focal length.

15. The image sensor of claim 14, further comprising a third thin lens configured to concentrate the light of the first wavelength with a second focal length that is different from the first focal length, the third thin lens comprising a plurality of fifth scatterers formed on the substrate.

16. The image sensor of claim 15, wherein each of the first thin lens and the third thin lens comprises a plurality of regions in which a phase modulation in a predetermined range is repeated, and the numbers of the plurality of regions in the first thin lens and the third thin lens are different from each other.

17. The image sensor of claim 15, wherein at least two of the plurality of fifth scatterers have different heights to each other.

18. The image sensor of claim 15, further comprising a fourth thin lens configured to concentrate the light of the second wavelength with the second focal length that is different from the first focal length, the fourth thin lens comprising a plurality of sixth scatterers formed on the substrate.

19. The image sensor of claim 15, wherein at least two of the plurality of sixth scatterers have different heights to each other.

20. The image sensor of claim 19, further comprising a low refractive index material layer covering the plurality of fifth scatterers and the plurality of sixth scatterers, wherein the third thin lens further comprises a plurality of seventh scatterers disposed on the low refractive index material layer, and the fourth thin lens further comprises a plurality of eighth scatterers disposed on the low refractive index material layer.

* * * * *